(12) United States Patent
Xu et al.

(10) Patent No.: US 9,090,955 B2
(45) Date of Patent: *Jul. 28, 2015

(54) NANOMATRIX POWDER METAL COMPOSITE

(75) Inventors: Zhiyue Xu, Cypress, TX (US); Soma Chakraborty, Houston, TX (US); Gaurav Agrawal, Aurora, CO (US)

(73) Assignee: Baker Hughes Incorporated, Houston, TX (US)

( * ) Notice: Subject to any disclaimer, the term of this patent is extended or adjusted under 35 U.S.C. 154(b) by 936 days.

This patent is subject to a terminal disclaimer.

(21) Appl. No.: 12/913,321

(22) Filed: Oct. 27, 2010

(65) Prior Publication Data

US 2012/0103135 A1   May 3, 2012

(51) Int. Cl.
| | |
|---|---|
| *B22F 3/12* | (2006.01) |
| *C22C 23/00* | (2006.01) |
| *B22F 1/02* | (2006.01) |
| *C22C 21/00* | (2006.01) |
| *C23C 16/14* | (2006.01) |
| *C23C 16/16* | (2006.01) |

(Continued)

(52) U.S. Cl.
CPC . *C22C 23/00* (2013.01); *B22F 1/02* (2013.01); *B22F 1/025* (2013.01); *C22C 21/00* (2013.01); *C23C 16/14* (2013.01); *C23C 16/16* (2013.01); *C23C 16/20* (2013.01); *C23C 16/442* (2013.01); *C23C 16/4417* (2013.01); *B22F 2999/00* (2013.01)

(58) Field of Classification Search
CPC ............... B22F 3/02; B22F 3/12; B22F 3/17
See application file for complete search history.

(56) References Cited

U.S. PATENT DOCUMENTS

| | | |
|---|---|---|
| 1,468,905 A | 9/1923 | Herman |
| 2,238,895 A | 4/1941 | Gage |

(Continued)

FOREIGN PATENT DOCUMENTS

| | | |
|---|---|---|
| CA | 2783241 A1 | 6/2011 |
| CA | 2783346 A1 | 6/2011 |

(Continued)

OTHER PUBLICATIONS

International Search Report and Written Opinion of the International Searching Authority, or the Declaration for PCT/US2011/058105 mailed from the Korean Intellectual Property Office on May 1, 2012.

(Continued)

*Primary Examiner* — Adam Krupicka
(74) *Attorney, Agent, or Firm* — Cantor Colburn LLP

(57) ABSTRACT

A powder metal composite is disclosed. The powder metal composite includes a substantially-continuous, cellular nanomatrix material. The compact also includes a plurality of dispersed particles comprising a particle core material that comprises Mg, Al, Zn or Mn, or a combination thereof, dispersed in the nanomatrix, the core material of the dispersed particles comprising a plurality a plurality of distributed carbon nanoparticles, and a bond layer extending throughout the nanomatrix between the dispersed particles. The nanomatrix powder metal composites are uniquely lightweight, high-strength materials that also provide uniquely selectable and controllable corrosion properties, including very rapid corrosion rates, useful for making a wide variety of degradable or disposable articles, including various downhole tools and components.

37 Claims, 7 Drawing Sheets

(51) Int. Cl.
*C23C 16/20* (2006.01)
*C23C 16/44* (2006.01)
*C23C 16/442* (2006.01)

(56) References Cited

U.S. PATENT DOCUMENTS

| | | | |
|---|---|---|---|
| 2,261,292 A | 11/1941 | Salnikov |
| 2,294,648 A | 9/1942 | Ansel et al. |
| 2,301,624 A | 11/1942 | Holt |
| 2,754,910 A | 7/1956 | Derrick et al. |
| 2,983,634 A | 5/1961 | Budininkas et al. |
| 3,057,405 A | 10/1962 | Mallinger |
| 3,106,959 A | 10/1963 | Huitt et al. |
| 3,152,009 A | 10/1964 | DeLong |
| 3,196,949 A | 7/1965 | Thomas |
| 3,242,988 A | 3/1966 | McGuire et al. |
| 3,316,748 A | 5/1967 | Lang et al. |
| 3,326,291 A | 6/1967 | Zandmer et al. |
| 3,347,317 A | 10/1967 | Zandemer |
| 3,347,714 A | 10/1967 | Broverman et al. |
| 3,390,724 A | 7/1968 | Caldwell |
| 3,395,758 A | 8/1968 | Kelly et al. |
| 3,406,101 A | 10/1968 | Kilpatrick |
| 3,434,537 A | 3/1969 | Zandmer |
| 3,465,181 A | 9/1969 | Colby et al. |
| 3,513,230 A | 5/1970 | Rhees et al. |
| 3,637,446 A | 1/1972 | Elliott et al. |
| 3,645,331 A | 2/1972 | Maurer et al. |
| 3,765,484 A | 10/1973 | Hamby, Jr. et al. |
| 3,768,563 A | 10/1973 | Blount |
| 3,775,823 A | 12/1973 | Adolph et al. |
| 3,878,889 A | 4/1975 | Seabourn |
| 3,894,850 A | 7/1975 | Kovalchuk et al. |
| 3,924,677 A | 12/1975 | Prenner et al. |
| 4,010,583 A | 3/1977 | Highberg |
| 4,039,717 A | 8/1977 | Titus |
| 4,050,529 A | 9/1977 | Tagirov et al. |
| 4,157,732 A | 6/1979 | Fonner |
| 4,248,307 A | 2/1981 | Silberman et al. |
| 4,372,384 A | 2/1983 | Kinney |
| 4,373,584 A | 2/1983 | Silberman et al. |
| 4,373,952 A | 2/1983 | Parent |
| 4,374,543 A | 2/1983 | Richardson |
| 4,384,616 A | 5/1983 | Dellinger |
| 4,395,440 A | 7/1983 | Abe et al. |
| 4,399,871 A | 8/1983 | Adkins et al. |
| 4,407,368 A | 10/1983 | Erbstoesser |
| 4,422,508 A | 12/1983 | Rutledge, Jr. et al. |
| 4,452,311 A | 6/1984 | Speegle et al. |
| 4,475,729 A | 10/1984 | Costigan |
| 4,498,543 A | 2/1985 | Pye et al. |
| 4,499,048 A | 2/1985 | Hanejko |
| 4,499,049 A | 2/1985 | Hanejko |
| 4,526,840 A | 7/1985 | Jerabek |
| 4,534,414 A | 8/1985 | Pringle |
| 4,539,175 A | 9/1985 | Lichti et al. |
| 4,554,986 A | 11/1985 | Jones |
| 4,640,354 A | 2/1987 | Boisson |
| 4,664,962 A | 5/1987 | DesMarais, Jr. |
| 4,668,470 A | 5/1987 | Gilman et al. |
| 4,673,549 A | 6/1987 | Ecer |
| 4,674,572 A | 6/1987 | Gallus |
| 4,678,037 A | 7/1987 | Smith |
| 4,681,133 A | 7/1987 | Weston |
| 4,688,641 A | 8/1987 | Knieriemen |
| 4,693,863 A | 9/1987 | Del Corso et al. |
| 4,703,807 A | 11/1987 | Weston |
| 4,706,753 A | 11/1987 | Ohkochi et al. |
| 4,708,202 A | 11/1987 | Sukup et al. |
| 4,708,208 A | 11/1987 | Halbardier |
| 4,709,761 A | 12/1987 | Setterberg, Jr. |
| 4,714,116 A | 12/1987 | Brunner |
| 4,716,964 A | 1/1988 | Erbstoesser et al. |
| 4,721,159 A | 1/1988 | Ohkochi et al. |
| 4,738,599 A | 4/1988 | Shilling |
| 4,741,973 A | 5/1988 | Condit et al. |
| 4,768,588 A | 9/1988 | Kupsa |
| 4,775,598 A | 10/1988 | Jaeckel |
| 4,784,226 A | 11/1988 | Wyatt |
| 4,805,699 A | 2/1989 | Halbardier |
| 4,817,725 A | 4/1989 | Jenkins |
| 4,834,184 A | 5/1989 | Streich et al. |
| H635 H | 6/1989 | Johnson et al. |
| 4,850,432 A | 7/1989 | Porter et al. |
| 4,853,056 A | 8/1989 | Hoffman |
| 4,869,324 A | 9/1989 | Holder |
| 4,869,325 A | 9/1989 | Halbardier |
| 4,889,187 A | 12/1989 | Terrell et al. |
| 4,890,675 A | 1/1990 | Dew |
| 4,909,320 A | 3/1990 | Hebert et al. |
| 4,929,415 A | 5/1990 | Okazaki |
| 4,932,474 A | 6/1990 | Schroeder, Jr. et al. |
| 4,938,309 A | 7/1990 | Emdy |
| 4,938,809 A | 7/1990 | Das et al. |
| 4,944,351 A | 7/1990 | Eriksen et al. |
| 4,949,788 A | 8/1990 | Szarka et al. |
| 4,952,902 A | 8/1990 | Kawaguchi et al. |
| 4,975,412 A | 12/1990 | Okazaki et al. |
| 4,977,958 A | 12/1990 | Miller |
| 4,981,177 A | 1/1991 | Carmody et al. |
| 4,986,361 A | 1/1991 | Mueller et al. |
| 4,997,622 A | 3/1991 | Regazzoni et al. |
| 5,006,044 A | 4/1991 | Walker, Sr. et al. |
| 5,010,955 A | 4/1991 | Springer |
| 5,036,921 A | 8/1991 | Pittard et al. |
| 5,048,611 A | 9/1991 | Cochran |
| 5,049,165 A | 9/1991 | Tselesin |
| 5,061,323 A | 10/1991 | DeLuccia |
| 5,063,775 A | 11/1991 | Walker, Sr. et al. |
| 5,073,207 A | 12/1991 | Faure et al. |
| 5,074,361 A | 12/1991 | Brisco et al. |
| 5,076,869 A | 12/1991 | Bourell et al. |
| 5,084,088 A | 1/1992 | Okazaki |
| 5,087,304 A | 2/1992 | Chang et al. |
| 5,090,480 A | 2/1992 | Pittard et al. |
| 5,095,988 A | 3/1992 | Bode |
| 5,103,911 A | 4/1992 | Heijnen |
| 5,117,915 A | 6/1992 | Mueller et al. |
| 5,161,614 A | 11/1992 | Wu et al. |
| 5,178,216 A | 1/1993 | Giroux et al. |
| 5,181,571 A | 1/1993 | Mueller et al. |
| 5,183,631 A | 2/1993 | Kugimiya et al. |
| 5,188,182 A | 2/1993 | Echols, III et al. |
| 5,188,183 A | 2/1993 | Hopmann et al. |
| 5,204,055 A | 4/1993 | Sachs et al. |
| 5,222,867 A | 6/1993 | Walker, Sr. et al. |
| 5,226,483 A | 7/1993 | Williamson, Jr. |
| 5,228,518 A | 7/1993 | Wilson et al. |
| 5,234,055 A | 8/1993 | Cornette |
| 5,252,365 A | 10/1993 | White |
| 5,253,714 A | 10/1993 | Davis et al. |
| 5,271,468 A | 12/1993 | Streich et al. |
| 5,282,509 A | 2/1994 | Schurr, III |
| 5,292,478 A | 3/1994 | Scorey |
| 5,293,940 A | 3/1994 | Hromas et al. |
| 5,304,260 A | 4/1994 | Aikawa et al. |
| 5,309,874 A | 5/1994 | Willermet et al. |
| 5,310,000 A | 5/1994 | Arterbury et al. |
| 5,316,598 A | 5/1994 | Chang et al. |
| 5,318,746 A | 6/1994 | Lashmore |
| 5,380,473 A | 1/1995 | Bogue et al. |
| 5,387,380 A | 2/1995 | Cima et al. |
| 5,392,860 A | 2/1995 | Ross |
| 5,394,941 A | 3/1995 | Venditto et al. |
| 5,398,754 A | 3/1995 | Dinhoble |
| 5,407,011 A | 4/1995 | Layton |
| 5,409,555 A | 4/1995 | Fujita et al. |
| 5,411,082 A | 5/1995 | Kennedy |
| 5,417,285 A | 5/1995 | Van Buskirk et al. |
| 5,425,424 A | 6/1995 | Reinhardt et al. |
| 5,427,177 A | 6/1995 | Jordan, Jr. et al. |
| 5,435,392 A | 7/1995 | Kennedy |
| 5,439,051 A | 8/1995 | Kennedy et al. |
| 5,454,430 A | 10/1995 | Kennedy et al. |

(56) References Cited

U.S. PATENT DOCUMENTS

| | | |
|---|---|---|
| 5,456,317 A | 10/1995 | Hood, III et al. |
| 5,456,327 A | 10/1995 | Denton et al. |
| 5,464,062 A | 11/1995 | Blizzard, Jr. |
| 5,472,048 A | 12/1995 | Kennedy et al. |
| 5,474,131 A | 12/1995 | Jordan, Jr. et al. |
| 5,477,923 A | 12/1995 | Jordan, Jr. et al. |
| 5,479,986 A | 1/1996 | Gano et al. |
| 5,507,439 A | 4/1996 | Story |
| 5,526,880 A | 6/1996 | Jordan, Jr. et al. |
| 5,526,881 A | 6/1996 | Martin et al. |
| 5,529,746 A | 6/1996 | Knoss et al. |
| 5,533,573 A | 7/1996 | Jordan, Jr. et al. |
| 5,536,485 A | 7/1996 | Kume et al. |
| 5,558,153 A | 9/1996 | Holcombe et al. |
| 5,607,017 A | 3/1997 | Owens et al. |
| 5,623,993 A | 4/1997 | Van Buskirk et al. |
| 5,623,994 A | 4/1997 | Robinson |
| 5,636,691 A | 6/1997 | Hendrickson et al. |
| 5,641,023 A | 6/1997 | Ross et al. |
| 5,647,444 A | 7/1997 | Williams |
| 5,665,289 A | 9/1997 | Chung et al. |
| 5,677,372 A | 10/1997 | Yamamoto et al. |
| 5,685,372 A | 11/1997 | Gano |
| 5,701,576 A | 12/1997 | Fujita et al. |
| 5,707,214 A | 1/1998 | Schmidt |
| 5,709,269 A | 1/1998 | Head |
| 5,720,344 A | 2/1998 | Newman |
| 5,728,195 A | 3/1998 | Eastman et al. |
| 5,765,639 A | 6/1998 | Muth |
| 5,772,735 A | 6/1998 | Sehgal et al. |
| 5,782,305 A | 7/1998 | Hicks |
| 5,797,454 A | 8/1998 | Hipp |
| 5,826,652 A | 10/1998 | Tapp |
| 5,826,661 A | 10/1998 | Parker et al. |
| 5,829,520 A | 11/1998 | Johnson |
| 5,836,396 A | 11/1998 | Norman |
| 5,857,521 A | 1/1999 | Ross et al. |
| 5,881,816 A | 3/1999 | Wright |
| 5,896,819 A | 4/1999 | Turila et al. |
| 5,902,424 A | 5/1999 | Fujita et al. |
| 5,934,372 A | 8/1999 | Muth |
| 5,941,309 A | 8/1999 | Appleton |
| 5,960,881 A | 10/1999 | Allamon et al. |
| 5,985,466 A | 11/1999 | Atarashi et al. |
| 5,990,051 A | 11/1999 | Ischy et al. |
| 5,992,452 A | 11/1999 | Nelson, II |
| 5,992,520 A | 11/1999 | Schultz et al. |
| 6,007,314 A | 12/1999 | Nelson, II |
| 6,024,915 A | 2/2000 | Kume et al. |
| 6,032,735 A | 3/2000 | Echols |
| 6,036,777 A | 3/2000 | Sachs |
| 6,047,773 A | 4/2000 | Zeltmann et al. |
| 6,050,340 A | 4/2000 | Scott |
| 6,069,313 A | 5/2000 | Kay |
| 6,076,600 A | 6/2000 | Vick, Jr. et al. |
| 6,079,496 A | 6/2000 | Hirth |
| 6,085,837 A | 7/2000 | Massinon et al. |
| 6,095,247 A | 8/2000 | Streich et al. |
| 6,119,783 A | 9/2000 | Parker et al. |
| 6,142,237 A | 11/2000 | Christmas et al. |
| 6,161,622 A | 12/2000 | Robb et al. |
| 6,167,970 B1 | 1/2001 | Stout et al. |
| 6,170,583 B1 | 1/2001 | Boyce |
| 6,173,779 B1 | 1/2001 | Smith |
| 6,189,616 B1 | 2/2001 | Gano et al. |
| 6,189,618 B1 | 2/2001 | Beeman et al. |
| 6,213,202 B1 | 4/2001 | Read, Jr. |
| 6,220,350 B1 | 4/2001 | Brothers et al. |
| 6,220,357 B1 | 4/2001 | Carmichael |
| 6,228,904 B1 | 5/2001 | Yadav et al. |
| 6,237,688 B1 | 5/2001 | Burleson et al. |
| 6,238,280 B1 | 5/2001 | Ritt et al. |
| 6,241,021 B1 | 6/2001 | Bowling |
| 6,248,399 B1 | 6/2001 | Hehmann |
| 6,250,392 B1 | 6/2001 | Muth |
| 6,261,432 B1 | 7/2001 | Huber et al. |
| 6,273,187 B1 | 8/2001 | Voisin, Jr. et al. |
| 6,276,452 B1 | 8/2001 | Davis et al. |
| 6,276,457 B1 | 8/2001 | Moffatt et al. |
| 6,279,656 B1 | 8/2001 | Sinclair et al. |
| 6,287,445 B1 | 9/2001 | Lashmore et al. |
| 6,302,205 B1 | 10/2001 | Ryll |
| 6,315,041 B1 | 11/2001 | Carlisle et al. |
| 6,315,050 B2 | 11/2001 | Vaynshteyn et al. |
| 6,325,148 B1 | 12/2001 | Trahan et al. |
| 6,328,110 B1 | 12/2001 | Joubert |
| 6,341,653 B1 | 1/2002 | Firmaniuk et al. |
| 6,341,747 B1 | 1/2002 | Schmidt et al. |
| 6,349,766 B1 | 2/2002 | Bussear et al. |
| 6,354,379 B2 | 3/2002 | Miszewski et al. |
| 6,357,332 B1 | 3/2002 | Vecchio |
| 6,371,206 B1 | 4/2002 | Mills |
| 6,372,346 B1 | 4/2002 | Toth |
| 6,382,244 B2 | 5/2002 | Vann |
| 6,390,195 B1 | 5/2002 | Nguyen et al. |
| 6,390,200 B1 | 5/2002 | Allamon et al. |
| 6,394,185 B1 | 5/2002 | Constien |
| 6,397,950 B1 | 6/2002 | Streich et al. |
| 6,403,210 B1 | 6/2002 | Stuivinga et al. |
| 6,408,946 B1 | 6/2002 | Marshall et al. |
| 6,419,023 B1 | 7/2002 | George et al. |
| 6,439,313 B1 | 8/2002 | Thomeer et al. |
| 6,457,525 B1 | 10/2002 | Scott |
| 6,467,546 B2 | 10/2002 | Allamon et al. |
| 6,470,965 B1 | 10/2002 | Winzer |
| 6,491,097 B1 | 12/2002 | ONeal et al. |
| 6,491,116 B2 | 12/2002 | Berscheidt et al. |
| 6,513,598 B2 | 2/2003 | Moore et al. |
| 6,540,033 B1 | 4/2003 | Sullivan et al. |
| 6,543,543 B2 | 4/2003 | Muth |
| 6,561,275 B2 | 5/2003 | Glass et al. |
| 6,588,507 B2 | 7/2003 | Dusterhoft et al. |
| 6,591,915 B2 | 7/2003 | Burris et al. |
| 6,601,648 B2 | 8/2003 | Ebinger |
| 6,601,650 B2 | 8/2003 | Sundararajan |
| 6,609,569 B2 | 8/2003 | Howlett et al. |
| 6,612,826 B1 | 9/2003 | Bauer et al. |
| 6,613,383 B1 | 9/2003 | George et al. |
| 6,619,400 B2 | 9/2003 | Brunet |
| 6,634,428 B2 | 10/2003 | Krauss et al. |
| 6,662,886 B2 | 12/2003 | Russell |
| 6,675,889 B1 | 1/2004 | Mullins et al. |
| 6,699,305 B2 | 3/2004 | Myrick |
| 6,713,177 B2 | 3/2004 | George et al. |
| 6,715,541 B2 | 4/2004 | Pedersen et al. |
| 6,719,051 B2 | 4/2004 | Hailey, Jr. et al. |
| 6,755,249 B2 | 6/2004 | Robison et al. |
| 6,776,228 B2 | 8/2004 | Pedersen et al. |
| 6,779,599 B2 | 8/2004 | Mullins et al. |
| 6,799,638 B2 | 10/2004 | Butterfield, Jr. |
| 6,810,960 B2 | 11/2004 | Pia |
| 6,817,414 B2 | 11/2004 | Lee |
| 6,831,044 B2 | 12/2004 | Constien |
| 6,883,611 B2 | 4/2005 | Smith et al. |
| 6,887,297 B2 | 5/2005 | Winter et al. |
| 6,896,049 B2 | 5/2005 | Moyes |
| 6,896,061 B2 | 5/2005 | Hriscu et al. |
| 6,899,176 B2 | 5/2005 | Hailey, Jr. et al. |
| 6,899,777 B2 | 5/2005 | Vaidyanathan et al. |
| 6,908,516 B2 | 6/2005 | Hehmann et al. |
| 6,913,827 B2 | 7/2005 | George et al. |
| 6,926,086 B2 | 8/2005 | Patterson et al. |
| 6,932,159 B2 | 8/2005 | Hovem |
| 6,939,388 B2 | 9/2005 | Angeliu |
| 6,945,331 B2 | 9/2005 | Patel |
| 6,951,331 B2 | 10/2005 | Haughom et al. |
| 6,959,759 B2 | 11/2005 | Doane et al. |
| 6,973,970 B2 | 12/2005 | Johnston et al. |
| 6,973,973 B2 | 12/2005 | Howard et al. |
| 6,983,796 B2 | 1/2006 | Bayne et al. |
| 6,986,390 B2 | 1/2006 | Doane et al. |
| 7,013,989 B2 | 3/2006 | Hammond et al. |
| 7,013,998 B2 | 3/2006 | Ray et al. |
| 7,017,664 B2 | 3/2006 | Walker et al. |

(56) References Cited

U.S. PATENT DOCUMENTS

| | | |
|---|---|---|
| 7,017,677 B2 | 3/2006 | Keshavan et al. |
| 7,021,389 B2 | 4/2006 | Bishop et al. |
| 7,025,146 B2 | 4/2006 | King et al. |
| 7,028,778 B2 | 4/2006 | Krywitsky |
| 7,044,230 B2 | 5/2006 | Starr et al. |
| 7,049,272 B2 | 5/2006 | Sinclair et al. |
| 7,051,805 B2 | 5/2006 | Doane et al. |
| 7,059,410 B2 | 6/2006 | Bousche et al. |
| 7,090,027 B1 | 8/2006 | Williams |
| 7,093,664 B2 | 8/2006 | Todd et al. |
| 7,096,945 B2 | 8/2006 | Richards et al. |
| 7,096,946 B2 | 8/2006 | Jasser et al. |
| 7,097,906 B2 | 8/2006 | Gardner |
| 7,108,080 B2 | 9/2006 | Tessari et al. |
| 7,111,682 B2 | 9/2006 | Blaisdell |
| 7,141,207 B2 | 11/2006 | Jandeska, Jr. et al. |
| 7,150,326 B2 | 12/2006 | Bishop et al. |
| 7,163,066 B2 | 1/2007 | Lehr |
| 7,168,494 B2 | 1/2007 | Starr et al. |
| 7,174,963 B2 | 2/2007 | Bertelsen |
| 7,182,135 B2 | 2/2007 | Szarka |
| 7,188,559 B1 | 3/2007 | Vecchio |
| 7,210,527 B2 | 5/2007 | Walker et al. |
| 7,210,533 B2 | 5/2007 | Starr et al. |
| 7,217,311 B2 * | 5/2007 | Hong et al. .................... 75/345 |
| 7,234,530 B2 | 6/2007 | Gass |
| 7,250,188 B2 | 7/2007 | Dodelet et al. |
| 7,252,162 B2 | 8/2007 | Akinlade et al. |
| 7,255,172 B2 | 8/2007 | Johnson |
| 7,255,178 B2 | 8/2007 | Slup et al. |
| 7,264,060 B2 | 9/2007 | Wills |
| 7,267,172 B2 | 9/2007 | Hofman |
| 7,267,178 B2 | 9/2007 | Krywitsky |
| 7,270,186 B2 | 9/2007 | Johnson |
| 7,287,592 B2 | 10/2007 | Surjaatmadja et al. |
| 7,311,152 B2 | 12/2007 | Howard et al. |
| 7,316,274 B2 | 1/2008 | Xu et al. |
| 7,320,365 B2 | 1/2008 | Pia |
| 7,322,412 B2 | 1/2008 | Badalamenti et al. |
| 7,322,417 B2 | 1/2008 | Rytlewski et al. |
| 7,325,617 B2 | 2/2008 | Murray |
| 7,328,750 B2 | 2/2008 | Swor et al. |
| 7,331,388 B2 | 2/2008 | Vilela et al. |
| 7,337,854 B2 | 3/2008 | Horn et al. |
| 7,346,456 B2 | 3/2008 | Le Bemadjiel |
| 7,350,582 B2 | 4/2008 | McKeachnie et al. |
| 7,353,879 B2 | 4/2008 | Todd et al. |
| 7,360,593 B2 | 4/2008 | Constien |
| 7,360,597 B2 | 4/2008 | Blaisdell |
| 7,363,970 B2 | 4/2008 | Corre et al. |
| 7,384,443 B2 | 6/2008 | Mirchandani |
| 7,387,158 B2 | 6/2008 | Murray et al. |
| 7,387,165 B2 | 6/2008 | Lopez de Cardenas et al. |
| 7,392,841 B2 | 7/2008 | Murray et al. |
| 7,401,648 B2 | 7/2008 | Richard |
| 7,416,029 B2 | 8/2008 | Telfer et al. |
| 7,422,058 B2 | 9/2008 | O'Malley |
| 7,426,964 B2 | 9/2008 | Lynde et al. |
| 7,441,596 B2 | 10/2008 | Wood et al. |
| 7,445,049 B2 | 11/2008 | Howard et al. |
| 7,451,815 B2 | 11/2008 | Hailey, Jr. |
| 7,451,817 B2 | 11/2008 | Reddy et al. |
| 7,461,699 B2 | 12/2008 | Richard et al. |
| 7,464,764 B2 | 12/2008 | Xu |
| 7,472,750 B2 | 1/2009 | Walker et al. |
| 7,478,676 B2 | 1/2009 | East, Jr. et al. |
| 7,503,390 B2 | 3/2009 | Gomez |
| 7,503,399 B2 | 3/2009 | Badalamenti et al. |
| 7,509,993 B1 | 3/2009 | Turng et al. |
| 7,510,018 B2 | 3/2009 | Williamson et al. |
| 7,513,311 B2 | 4/2009 | Gramstad et al. |
| 7,527,103 B2 | 5/2009 | Huang et al. |
| 7,537,825 B1 | 5/2009 | Wardle et al. |
| 7,552,777 B2 | 6/2009 | Murray et al. |
| 7,552,779 B2 | 6/2009 | Murray |
| 7,559,357 B2 | 7/2009 | Clem |
| 7,575,062 B2 | 8/2009 | East, Jr. |
| 7,579,087 B2 | 8/2009 | Maloney et al. |
| 7,591,318 B2 | 9/2009 | Tilghman |
| 7,600,572 B2 | 10/2009 | Slup et al. |
| 7,604,049 B2 | 10/2009 | Vaidya et al. |
| 7,604,055 B2 | 10/2009 | Richard et al. |
| 7,617,871 B2 | 11/2009 | Surjaatmadja et al. |
| 7,635,023 B2 | 12/2009 | Goldberg et al. |
| 7,640,988 B2 | 1/2010 | Phi et al. |
| 7,661,480 B2 | 2/2010 | Al-Anazi |
| 7,661,481 B2 | 2/2010 | Todd et al. |
| 7,665,537 B2 | 2/2010 | Patel et al. |
| 7,686,082 B2 | 3/2010 | Marsh |
| 7,690,436 B2 | 4/2010 | Turley et al. |
| 7,699,101 B2 | 4/2010 | Fripp et al. |
| 7,703,510 B2 | 4/2010 | Xu |
| 7,703,511 B2 | 4/2010 | Buyers et al. |
| 7,708,078 B2 | 5/2010 | Stoesz |
| 7,709,421 B2 | 5/2010 | Jones et al. |
| 7,712,541 B2 | 5/2010 | Loretz et al. |
| 7,723,272 B2 | 5/2010 | Crews et al. |
| 7,726,406 B2 | 6/2010 | Xu |
| 7,735,578 B2 | 6/2010 | Loehr et al. |
| 7,752,971 B2 | 7/2010 | Loehr |
| 7,757,773 B2 | 7/2010 | Rytlewski |
| 7,762,342 B2 | 7/2010 | Richard et al. |
| 7,770,652 B2 | 8/2010 | Barnett |
| 7,775,284 B2 | 8/2010 | Richards et al. |
| 7,775,285 B2 | 8/2010 | Surjaatmadja et al. |
| 7,775,286 B2 | 8/2010 | Duphorne |
| 7,784,543 B2 | 8/2010 | Johnson |
| 7,793,714 B2 | 9/2010 | Johnson |
| 7,798,225 B2 | 9/2010 | Giroux et al. |
| 7,798,226 B2 | 9/2010 | Themig |
| 7,798,236 B2 | 9/2010 | McKeachnie et al. |
| 7,806,189 B2 | 10/2010 | Frazier |
| 7,806,192 B2 | 10/2010 | Foster et al. |
| 7,810,553 B2 | 10/2010 | Cruickshank et al. |
| 7,810,567 B2 | 10/2010 | Daniels et al. |
| 7,819,198 B2 | 10/2010 | Birckhead et al. |
| 7,828,055 B2 | 11/2010 | Willauer et al. |
| 7,833,944 B2 | 11/2010 | Munoz et al. |
| 7,849,927 B2 | 12/2010 | Herrera |
| 7,855,168 B2 | 12/2010 | Fuller et al. |
| 7,861,779 B2 | 1/2011 | Vestavik |
| 7,861,781 B2 | 1/2011 | D'Arcy |
| 7,874,365 B2 | 1/2011 | East, Jr. et al. |
| 7,878,253 B2 | 2/2011 | Stowe et al. |
| 7,896,091 B2 | 3/2011 | Williamson et al. |
| 7,897,063 B1 | 3/2011 | Perry et al. |
| 7,900,696 B1 | 3/2011 | Nish et al. |
| 7,900,703 B2 | 3/2011 | Clark et al. |
| 7,909,096 B2 | 3/2011 | Clark et al. |
| 7,909,104 B2 | 3/2011 | Bjorgum |
| 7,909,110 B2 | 3/2011 | Sharma et al. |
| 7,909,115 B2 | 3/2011 | Grove et al. |
| 7,913,765 B2 | 3/2011 | Crow et al. |
| 7,931,093 B2 | 4/2011 | Foster et al. |
| 7,938,191 B2 | 5/2011 | Vaidya |
| 7,946,335 B2 | 5/2011 | Bewlay et al. |
| 7,946,340 B2 | 5/2011 | Surjaatmadja et al. |
| 7,958,940 B2 | 6/2011 | Jameson |
| 7,963,331 B2 | 6/2011 | Surjaatmadja et al. |
| 7,963,340 B2 | 6/2011 | Gramstad et al. |
| 7,963,342 B2 | 6/2011 | George |
| 7,980,300 B2 | 7/2011 | Roberts et al. |
| 7,987,906 B1 | 8/2011 | Troy |
| 7,992,763 B2 | 8/2011 | Vecchio et al. |
| 8,020,619 B1 | 9/2011 | Robertson et al. |
| 8,020,620 B2 | 9/2011 | Daniels et al. |
| 8,025,104 B2 | 9/2011 | Cooke, Jr. |
| 8,028,767 B2 | 10/2011 | Radford et al. |
| 8,033,331 B2 | 10/2011 | Themig |
| 8,039,422 B1 | 10/2011 | Al-Zahrani |
| 8,056,628 B2 | 11/2011 | Whitsitt et al. |
| 8,056,638 B2 | 11/2011 | Clayton et al. |
| 8,109,340 B2 | 2/2012 | Doane et al. |
| 8,127,856 B1 | 3/2012 | Nish et al. |

(56) References Cited

U.S. PATENT DOCUMENTS

| | | | |
|---|---|---|---|
| 8,153,052 B2 | 4/2012 | Jackson et al. |
| 8,163,060 B2 | 4/2012 | Imanishi et al. |
| 8,211,247 B2 | 7/2012 | Marya et al. |
| 8,211,248 B2 | 7/2012 | Marya |
| 8,226,740 B2 | 7/2012 | Chaumonnot et al. |
| 8,230,731 B2 | 7/2012 | Dyer et al. |
| 8,231,947 B2 | 7/2012 | Vaidya et al. |
| 8,276,670 B2 | 10/2012 | Patel |
| 8,277,974 B2 | 10/2012 | Kumar et al. |
| 8,327,931 B2 | 12/2012 | Agrawal et al. |
| 8,403,037 B2 | 3/2013 | Agrawal et al. |
| 8,425,651 B2 | 4/2013 | Xu et al. |
| 2001/0045285 A1 | 11/2001 | Russell |
| 2001/0045288 A1 | 11/2001 | Allamon et al. |
| 2002/0000319 A1 | 1/2002 | Brunet |
| 2002/0007948 A1 | 1/2002 | Bayne et al. |
| 2002/0014268 A1 | 2/2002 | Vann |
| 2002/0066572 A1 | 6/2002 | Muth |
| 2002/0104616 A1 | 8/2002 | De et al. |
| 2002/0136904 A1 | 9/2002 | Glass et al. |
| 2002/0162661 A1 | 11/2002 | Krauss et al. |
| 2003/0037925 A1 | 2/2003 | Walker et al. |
| 2003/0060374 A1 | 3/2003 | Cooke, Jr. |
| 2003/0075326 A1 | 4/2003 | Ebinger |
| 2003/0104147 A1 | 6/2003 | Bretschneider et al. |
| 2003/0111728 A1 | 6/2003 | Thai et al. |
| 2003/0127013 A1 | 7/2003 | Zavitsanos et al. |
| 2003/0141060 A1 | 7/2003 | Hailey et al. |
| 2003/0141061 A1 | 7/2003 | Hailey et al. |
| 2003/0141079 A1 | 7/2003 | Doane et al. |
| 2003/0150614 A1 | 8/2003 | Brown et al. |
| 2003/0155114 A1 | 8/2003 | Pedersen et al. |
| 2003/0155115 A1 | 8/2003 | Pedersen et al. |
| 2003/0159828 A1 | 8/2003 | Howard et al. |
| 2003/0164237 A1 | 9/2003 | Butterfield |
| 2003/0183391 A1 | 10/2003 | Hriscu et al. |
| 2004/0005483 A1 | 1/2004 | Lin |
| 2004/0020832 A1 | 2/2004 | Richards et al. |
| 2004/0031605 A1 | 2/2004 | Mickey |
| 2004/0045723 A1 | 3/2004 | Slup et al. |
| 2004/0055758 A1 | 3/2004 | Brezinski et al. |
| 2004/0089449 A1 | 5/2004 | Walton et al. |
| 2004/0154806 A1 | 8/2004 | Bode et al. |
| 2004/0159428 A1 | 8/2004 | Hammond et al. |
| 2004/0182583 A1 | 9/2004 | Doane et al. |
| 2004/0231845 A1 | 11/2004 | Cooke, Jr. |
| 2004/0256109 A1 | 12/2004 | Johnson |
| 2004/0256157 A1 | 12/2004 | Tessari et al. |
| 2004/0261993 A1 | 12/2004 | Nguyen |
| 2005/0034876 A1 | 2/2005 | Doane et al. |
| 2005/0051329 A1 | 3/2005 | Blaisdell |
| 2005/0064247 A1 | 3/2005 | Sane et al. |
| 2005/0069449 A1 | 3/2005 | Jackson et al. |
| 2005/0102255 A1 | 5/2005 | Bultman |
| 2005/0106316 A1 | 5/2005 | Rigney et al. |
| 2005/0161212 A1 | 7/2005 | Leismer et al. |
| 2005/0161224 A1 | 7/2005 | Starr et al. |
| 2005/0165149 A1 | 7/2005 | Chanak et al. |
| 2005/0194143 A1 | 9/2005 | Xu et al. |
| 2005/0199401 A1 | 9/2005 | Patel et al. |
| 2005/0205264 A1 | 9/2005 | Starr et al. |
| 2005/0205265 A1 | 9/2005 | Todd et al. |
| 2005/0205266 A1 | 9/2005 | Todd et al. |
| 2005/0241824 A1 | 11/2005 | Burris, II et al. |
| 2005/0241825 A1 | 11/2005 | Burris, II et al. |
| 2005/0257936 A1 | 11/2005 | Lehr |
| 2005/0279501 A1 | 12/2005 | Surjaatmadja et al. |
| 2006/0012087 A1 | 1/2006 | Matsuda et al. |
| 2006/0045787 A1 | 3/2006 | Jandeska, Jr. et al. |
| 2006/0057479 A1 | 3/2006 | Niimi et al. |
| 2006/0081378 A1 | 4/2006 | Howard et al. |
| 2006/0102871 A1 | 5/2006 | Wang et al. |
| 2006/0108114 A1 | 5/2006 | Johnson et al. |
| 2006/0108126 A1 | 5/2006 | Horn et al. |
| 2006/0110615 A1 | 5/2006 | Karim et al. |
| 2006/0116696 A1 | 6/2006 | Odermatt et al. |
| 2006/0124310 A1 | 6/2006 | Lopez de Cardenas |
| 2006/0124312 A1 | 6/2006 | Rytlewski et al. |
| 2006/0131011 A1 | 6/2006 | Lynde et al. |
| 2006/0131031 A1 | 6/2006 | McKeachnie et al. |
| 2006/0131081 A1 | 6/2006 | Mirchandani et al. |
| 2006/0144515 A1 | 7/2006 | Tada et al. |
| 2006/0150770 A1 | 7/2006 | Freim, III et al. |
| 2006/0151178 A1 | 7/2006 | Howard et al. |
| 2006/0162927 A1 | 7/2006 | Walker et al. |
| 2006/0169453 A1 | 8/2006 | Savery et al. |
| 2006/0207763 A1 | 9/2006 | Hofman et al. |
| 2006/0213670 A1 | 9/2006 | Bishop et al. |
| 2006/0231253 A1 | 10/2006 | Vilela et al. |
| 2006/0283592 A1 | 12/2006 | Sierra et al. |
| 2007/0017674 A1 | 1/2007 | Blaisdell |
| 2007/0017675 A1 | 1/2007 | Hammami et al. |
| 2007/0029082 A1 | 2/2007 | Giroux et al. |
| 2007/0039741 A1 | 2/2007 | Hailey |
| 2007/0044958 A1 | 3/2007 | Rytlewski et al. |
| 2007/0044966 A1 | 3/2007 | Davies et al. |
| 2007/0051521 A1 | 3/2007 | Fike et al. |
| 2007/0053785 A1 | 3/2007 | Hetz et al. |
| 2007/0054101 A1 | 3/2007 | Sigalas et al. |
| 2007/0057415 A1 | 3/2007 | Katagiri et al. |
| 2007/0062644 A1 | 3/2007 | Nakamura et al. |
| 2007/0074873 A1 | 4/2007 | McKeachnie et al. |
| 2007/0102199 A1 | 5/2007 | Smith et al. |
| 2007/0107899 A1 | 5/2007 | Werner et al. |
| 2007/0107908 A1 | 5/2007 | Vaidya et al. |
| 2007/0108060 A1 | 5/2007 | Park |
| 2007/0119600 A1 | 5/2007 | Slup et al. |
| 2007/0131912 A1 | 6/2007 | Simone et al. |
| 2007/0151009 A1 | 7/2007 | Conrad, III et al. |
| 2007/0151769 A1 | 7/2007 | Slutz et al. |
| 2007/0169935 A1 | 7/2007 | Akbar et al. |
| 2007/0181224 A1 | 8/2007 | Marya et al. |
| 2007/0185655 A1 | 8/2007 | Le Bemadjiel |
| 2007/0187095 A1 | 8/2007 | Walker et al. |
| 2007/0221373 A1 | 9/2007 | Murray |
| 2007/0221384 A1 | 9/2007 | Murray |
| 2007/0259994 A1 | 11/2007 | Tour et al. |
| 2007/0261862 A1 | 11/2007 | Murray |
| 2007/0272411 A1 | 11/2007 | Lopez De Cardenas et al. |
| 2007/0272413 A1 | 11/2007 | Rytlewski et al. |
| 2007/0277979 A1 | 12/2007 | Todd et al. |
| 2007/0284109 A1 | 12/2007 | East et al. |
| 2007/0284112 A1 | 12/2007 | Magne et al. |
| 2007/0299510 A1 | 12/2007 | Venkatraman et al. |
| 2008/0011473 A1 | 1/2008 | Wood et al. |
| 2008/0020923 A1 | 1/2008 | Debe et al. |
| 2008/0047707 A1 | 2/2008 | Boney et al. |
| 2008/0060810 A9 | 3/2008 | Nguyen et al. |
| 2008/0066923 A1 | 3/2008 | Xu |
| 2008/0066924 A1 | 3/2008 | Xu |
| 2008/0078553 A1 | 4/2008 | George |
| 2008/0081866 A1 | 4/2008 | Gong et al. |
| 2008/0099209 A1 | 5/2008 | Loretz et al. |
| 2008/0105438 A1 | 5/2008 | Jordan et al. |
| 2008/0115932 A1 | 5/2008 | Cooke |
| 2008/0121390 A1 | 5/2008 | O'Malley et al. |
| 2008/0121436 A1 | 5/2008 | Slay et al. |
| 2008/0127475 A1 | 6/2008 | Griffo |
| 2008/0135249 A1 | 6/2008 | Fripp et al. |
| 2008/0149325 A1 | 6/2008 | Crawford |
| 2008/0149345 A1 | 6/2008 | Marya et al. |
| 2008/0149351 A1 | 6/2008 | Marya et al. |
| 2008/0169105 A1 | 7/2008 | Williamson et al. |
| 2008/0179060 A1 | 7/2008 | Surjaatmadja et al. |
| 2008/0179104 A1 | 7/2008 | Zhang et al. |
| 2008/0202764 A1 | 8/2008 | Clayton et al. |
| 2008/0202814 A1 | 8/2008 | Lyons et al. |
| 2008/0210473 A1* | 9/2008 | Zhang et al. ............... 175/426 |
| 2008/0216383 A1 | 9/2008 | Pierick et al. |
| 2008/0223586 A1 | 9/2008 | Barnett |
| 2008/0223587 A1 | 9/2008 | Cherewyk |
| 2008/0236829 A1 | 10/2008 | Lynde |
| 2008/0248205 A1 | 10/2008 | Blanchet et al. |
| 2008/0277109 A1 | 11/2008 | Vaidya |

(56) References Cited

U.S. PATENT DOCUMENTS

| | | |
|---|---|---|
| 2008/0277980 A1 | 11/2008 | Koda et al. |
| 2008/0282924 A1 | 11/2008 | Saenger et al. |
| 2008/0296024 A1 | 12/2008 | Huang et al. |
| 2008/0314581 A1 | 12/2008 | Brown |
| 2008/0314588 A1 | 12/2008 | Langlais et al. |
| 2009/0038858 A1 | 2/2009 | Griffo et al. |
| 2009/0044946 A1 | 2/2009 | Schasteen et al. |
| 2009/0044949 A1 | 2/2009 | King et al. |
| 2009/0050334 A1 | 2/2009 | Marya et al. |
| 2009/0056934 A1 | 3/2009 | Xu |
| 2009/0065216 A1 | 3/2009 | Frazier |
| 2009/0084553 A1 | 4/2009 | Rytlewski et al. |
| 2009/0084556 A1 | 4/2009 | Richards et al. |
| 2009/0084600 A1 | 4/2009 | Severance |
| 2009/0090440 A1 | 4/2009 | Kellett et al. |
| 2009/0107684 A1 | 4/2009 | Cooke, Jr. |
| 2009/0114381 A1 | 5/2009 | Stroobants |
| 2009/0114382 A1 | 5/2009 | Grove et al. |
| 2009/0145666 A1 | 6/2009 | Radford et al. |
| 2009/0151949 A1 | 6/2009 | Marya et al. |
| 2009/0152009 A1 | 6/2009 | Slay et al. |
| 2009/0155616 A1 | 6/2009 | Thamida et al. |
| 2009/0159289 A1 | 6/2009 | Avant et al. |
| 2009/0178808 A1 | 7/2009 | Williamson et al. |
| 2009/0194273 A1 | 8/2009 | Surjaatmadja et al. |
| 2009/0205841 A1 | 8/2009 | Kluge et al. |
| 2009/0226340 A1 | 9/2009 | Marya |
| 2009/0226704 A1 | 9/2009 | Kauppinen et al. |
| 2009/0242202 A1 | 10/2009 | Rispler et al. |
| 2009/0242208 A1 | 10/2009 | Bolding |
| 2009/0242214 A1 | 10/2009 | Foster et al. |
| 2009/0255667 A1 | 10/2009 | Clem et al. |
| 2009/0255684 A1 | 10/2009 | Bolding |
| 2009/0255686 A1 | 10/2009 | Richard et al. |
| 2009/0260817 A1 | 10/2009 | Gambier et al. |
| 2009/0266548 A1 | 10/2009 | Olsen et al. |
| 2009/0272544 A1 | 11/2009 | Giroux et al. |
| 2009/0283270 A1 | 11/2009 | Langeslag |
| 2009/0293672 A1 | 12/2009 | Mirchandani et al. |
| 2009/0301730 A1 | 12/2009 | Gweily |
| 2009/0305131 A1 | 12/2009 | Kumar et al. |
| 2009/0308588 A1 | 12/2009 | Howell et al. |
| 2009/0317556 A1 | 12/2009 | Macary |
| 2010/0003536 A1 | 1/2010 | Smith et al. |
| 2010/0012385 A1 | 1/2010 | Drivdahl et al. |
| 2010/0015002 A1 | 1/2010 | Barrera et al. |
| 2010/0015469 A1 | 1/2010 | Romanowski |
| 2010/0025255 A1 | 2/2010 | Su et al. |
| 2010/0032151 A1 | 2/2010 | Duphorne |
| 2010/0040180 A1 | 2/2010 | Kim et al. |
| 2010/0044041 A1 | 2/2010 | Smith et al. |
| 2010/0051278 A1 | 3/2010 | Mytopher et al. |
| 2010/0055491 A1 | 3/2010 | Vecchio et al. |
| 2010/0055492 A1 | 3/2010 | Barsoum et al. |
| 2010/0089583 A1 | 4/2010 | Xu et al. |
| 2010/0089587 A1 | 4/2010 | Stout |
| 2010/0101803 A1 | 4/2010 | Clayton et al. |
| 2010/0122817 A1 | 5/2010 | Surjaatmadja et al. |
| 2010/0139930 A1 | 6/2010 | Patel et al. |
| 2010/0200230 A1 | 8/2010 | East, Jr. et al. |
| 2010/0236793 A1 | 9/2010 | Bjorgum |
| 2010/0236794 A1 | 9/2010 | Duan et al. |
| 2010/0243254 A1 | 9/2010 | Murphy et al. |
| 2010/0252273 A1 | 10/2010 | Duphorne |
| 2010/0252280 A1 | 10/2010 | Swor et al. |
| 2010/0270031 A1 | 10/2010 | Patel |
| 2010/0276136 A1 | 11/2010 | Evans et al. |
| 2010/0282338 A1 | 11/2010 | Gerrard et al. |
| 2010/0282469 A1 | 11/2010 | Richard et al. |
| 2010/0294510 A1 | 11/2010 | Holmes |
| 2010/0319870 A1 | 12/2010 | Bewlay et al. |
| 2011/0005773 A1 | 1/2011 | Dusterhoft et al. |
| 2011/0036592 A1 | 2/2011 | Fay |
| 2011/0048743 A1 | 3/2011 | Stafford et al. |
| 2011/0056692 A1 | 3/2011 | Lopez de Cardenas et al. |
| 2011/0056702 A1 | 3/2011 | Sharma et al. |
| 2011/0067872 A1 | 3/2011 | Agrawal |
| 2011/0067889 A1 | 3/2011 | Marya et al. |
| 2011/0067890 A1 | 3/2011 | Themig |
| 2011/0094406 A1 | 4/2011 | Marya et al. |
| 2011/0100643 A1 | 5/2011 | Themig et al. |
| 2011/0127044 A1 | 6/2011 | Radford et al. |
| 2011/0132143 A1 | 6/2011 | Xu et al. |
| 2011/0132612 A1 | 6/2011 | Agrawal et al. |
| 2011/0132619 A1 | 6/2011 | Agrawal et al. |
| 2011/0132620 A1 | 6/2011 | Agrawal et al. |
| 2011/0132621 A1 | 6/2011 | Agrawal et al. |
| 2011/0135530 A1 | 6/2011 | Xu et al. |
| 2011/0135805 A1 | 6/2011 | Doucet et al. |
| 2011/0135953 A1 | 6/2011 | Xu et al. |
| 2011/0136707 A1 | 6/2011 | Xu et al. |
| 2011/0139465 A1 | 6/2011 | Tibbles et al. |
| 2011/0147014 A1 | 6/2011 | Chen et al. |
| 2011/0186306 A1 | 8/2011 | Marya et al. |
| 2011/0214881 A1 | 9/2011 | Newton et al. |
| 2011/0247833 A1 | 10/2011 | Todd et al. |
| 2011/0253387 A1 | 10/2011 | Ervin |
| 2011/0256356 A1 | 10/2011 | Tomantschger et al. |
| 2011/0259610 A1 | 10/2011 | Shkurti et al. |
| 2011/0277987 A1 | 11/2011 | Frazier |
| 2011/0277989 A1 | 11/2011 | Frazier |
| 2011/0284232 A1 | 11/2011 | Huang |
| 2011/0284240 A1 | 11/2011 | Chen et al. |
| 2011/0284243 A1 | 11/2011 | Frazier |
| 2011/0300403 A1 | 12/2011 | Vecchio et al. |
| 2012/0067426 A1 | 3/2012 | Soni et al. |
| 2012/0107590 A1 | 5/2012 | Xu et al. |
| 2012/0118583 A1 | 5/2012 | Johnson et al. |
| 2012/0130470 A1 | 5/2012 | Agnew et al. |
| 2012/0145389 A1 | 6/2012 | Fitzpatrick, Jr. |
| 2012/0168152 A1 | 7/2012 | Casciaro |
| 2012/0211239 A1 | 8/2012 | Kritzler et al. |
| 2012/0267101 A1 | 10/2012 | Cooke |
| 2012/0292053 A1 | 11/2012 | Xu et al. |
| 2012/0318513 A1 | 12/2012 | Mazyar et al. |
| 2013/0004847 A1 | 1/2013 | Kumar et al. |
| 2013/0025409 A1 | 1/2013 | Xu |
| 2013/0032357 A1 | 2/2013 | Mazyar et al. |
| 2013/0048304 A1 | 2/2013 | Agrawal et al. |
| 2013/0052472 A1 | 2/2013 | Xu |
| 2013/0081814 A1 | 4/2013 | Gaudette et al. |
| 2013/0105159 A1 | 5/2013 | Alvarez et al. |
| 2013/0126190 A1 | 5/2013 | Mazyar et al. |
| 2013/0133897 A1 | 5/2013 | Baihly et al. |
| 2013/0146144 A1 | 6/2013 | Joseph et al. |
| 2013/0146302 A1 | 6/2013 | Gaudette et al. |
| 2013/0186626 A1 | 7/2013 | Aitken et al. |
| 2013/0240203 A1 | 9/2013 | Frazier |
| 2013/0327540 A1 | 12/2013 | Hamid et al. |
| 2014/0116711 A1 | 5/2014 | Tang et al. |

FOREIGN PATENT DOCUMENTS

| | | |
|---|---|---|
| CN | 1076968 A | 10/1993 |
| CN | 1255879 A | 6/2000 |
| CN | 101050417 A | 10/2007 |
| CN | 101351523 A | 1/2009 |
| CN | 101457321 B | 6/2010 |
| EP | 0033625 A1 | 8/1981 |
| EP | 1798301 A1 | 8/2006 |
| EP | 1857570 A2 | 11/2007 |
| GB | 912956 | 12/1962 |
| JP | 61067770 | 4/1986 |
| JP | 07-054008 | 2/1995 |
| JP | 754008 A | 2/1995 |
| JP | 08232029 | 9/1996 |
| JP | 2000185725 A1 | 7/2000 |
| JP | 2004225084 | 8/2004 |
| JP | 2004225765 A | 8/2004 |
| JP | 2005076052 A | 3/2005 |
| JP | 2010502840 A | 1/2010 |
| KR | 95-0014350 B1 | 11/1995 |
| WO | 9947726 A1 | 9/1999 |
| WO | 2008034042 A3 | 3/2008 |

(56) References Cited

FOREIGN PATENT DOCUMENTS

| WO | 2008/057045 A1 | 5/2008 |
| WO | 2008057045 A1 | 5/2008 |
| WO | 2008079777 A3 | 7/2008 |
| WO | WO2008079485 | 7/2008 |
| WO | 2009079745 A1 | 7/2009 |
| WO | 2011071902 A3 | 6/2011 |
| WO | 2011071910 A2 | 6/2011 |
| WO | 2011071910 A3 | 6/2011 |
| WO | 2012174101 A2 | 12/2012 |
| WO | 2013053057 A1 | 4/2013 |
| WO | 2013078031 A1 | 5/2013 |

OTHER PUBLICATIONS

International Search Report and Written Opinion of the International Searching Authority for International Application No. PCT/US2011/058099 (filed on Oct. 27, 2011), mailed on May 11, 2012.
Chang, et al.; "Electrodeposition of Aluminum on Magnesium Alloy in Aluminum Chloride (A1C13)-1-ethyl-3-methylimidazolium chloride (EMIC) Ionic Liquid and Its Corrosion Behavior"; Electrochemistry Communications; 9; pp. 1602-1606; (2007).
Forsyth, et al.; "An Ionic Liquid Surface Treatment for Corrosion Protection of Magnesium Alloy AZ31"; Electrochem. Solid-State Lett./ 9(11); Abstract only; 1 page.
Forsyth, et al.; "Exploring Corrosion Protection of Mg via Ionic Liquid Pretreatment"; Surface & Coatings Technology; 201; pp. 4496-4504; (2007).
Hsiao et al.; "Effect of Heat Treatment on Anodization and Electrochemical Behavior of AZ91D Magnesium Alloy"; J. Mater. Res.; 20(10); pp. 2763-2771;(2005).
Hsiao, et al.; "Anodization of AZ91D Magnesium Alloy in Silicate-Containing Electrolytes"; Surface & Coatings Technology; 199; pp. 127-134; (2005).
Hsiao, et al.; "Baking Treatment Effect on Materials Characteristics and Electrochemical Behavior of anodic Film Formed on AZ91D Magnesium Alloy"; Corrosion Science; 49; pp. 781-793; (2007).
Hsiao, et al.; "Characterization of Anodic Films Formed on AZ91D Magnesium Alloy"; Surface & Coatings Technology; 190; pp. 299-308; (2005).
Huo et al.; "Corrosion of AZ91D Magnesium Alloy with a Chemical Conversion Coating and Electroless Nickel Layer"; Corrosion Science: 46; pp. 1467-1477; (2004).
Liu, et al.; "Electroless Nickel Plating on AZ91 Mg Alloy Substrate"; Surface & Coatings Technology; 200; pp. 5087-5093; (2006).
Lunder et al.; "The Role of Mg17Al12 Phase in the Corrosion of Mg Alloy AZ91"; Corrosion; 45(9); pp. 741-748; (1989).
Shi et al.; "Influence of the Beta Phase on the Corrosion Performance of Anodised Coatings on Magnesium-Aluminium Alloys"; Corrosion Science; 47; pp. 2760-2777; (2005).
Song, Guangling; "Recent Progress in Corrosion and Protection of Magnesium Alloys"; Advanced Engineering Materials; 7(7); pp. 563-586; (2005).
Song, et al.; "Influence of Microstructure on the Corrosion of Diecast AZ91D"; Corrosion Science; 41; pp. 249-273; (1999).
Song, et al.; "Corrosion Behaviour of AZ21, AZ501 and AZ91 in Sodium Chloride"; Corrosion Science; 40(10); pp. 1769-1791; (1998).
Zhang, et al; "Study on the Environmentally Friendly Anodizing of AZ91D Magnesium Alloy"; Surface and Coatings Technology: 161; pp. 36-43; (2002).
Canadian Pat. App. No. 2783241 filed on Dec. 7, 2010, published on Jun. 16, 2011 for "Nanomatrix Powder Metal Compact".
Canadian Pat. App. No. 2783346 filed on Dec. 7, 2010, published on Jun. 16, 2011 for "Engineered Powder Compact Composite Material".
Baker Hughes Tools. "Baker Oil Tools Introduces Revolutionary Sand Control Completion Technology," May 2, 2005.
E. Paul Bercegeay et al., "A One-Trip Gravel Packing System"; Society of Petroleum Engineers, Offshore Technology Conference, SPE Paper No. 4771; Feb. 7-8, 1974.
Bybee, Karen. "One-Trip Completion System Eliminates Perforations," Completions Today, Sep. 2007, pp. 52-53.
Curtin, William and Brian Sheldon. "CNT-reinforced ceramics and metals," Materials Today, 2004, vol. 7, 44-49.
Galanty et al. "Consolidation of metal powders during the extrusion process," Journal of Materials Processing Technology (2002), pp. 491-496.
Hjortstam et al. "Can we achieve ultra-low resistivity in carbon nanotube-based metal composites," Applied Physics A (2004), vol. 78, Issue 8, pp. 1175-1179.
Notification of Transmittal of the International Search Report and the Written Opinion of the International Searching Authority; PCT/US2010/059259; International Searching Authority KIPO; Mailed Jun. 13, 2011.
Notification of Transmittal of the International Search Report and the Written Opinion of the International Searching Authority; PCT/US2010/059265; International Searching Authority KIPO; Mailed Jun. 16, 2011.
Notification of Transmittal of the International Search Report and the Written Opinion of the International Searching Authority; PCT/US2010/059268; International Searching Authority KIPO; Mailed Jun. 17, 2011.
Stephen P. Mathis, "Sand Management: A Review of Approaches and Concerns"; Society of Petroleum Engineers, SPE Paper No. 82240; SPE European Formation Damage Conference, The Hague, The Netherlands, May 13-14, 2003.
Pardo, et al.; "Corrosion Behaviour of Magnesium/Aluminium Alloys in 3.5 wt% NaCl"; Corrosion Science; 50; pp. 823-834; (2008).
Notification of Transmittal of the International Search Report and Written Opinion, Mailed Jul. 8, 2011, International Appln. No. PCT/US2010/059263, Written Opinion 4 Pages, International Search Report 3 Pages.
Song, G. and S. Song. "A Possible Biodegradable Magnesium Implant Material," Advanced Engineering Materials, vol. 9, Issue 4, Apr. 2007, pp. 298-302.
Song, et al.; "Understanding Magnesium Corrosion"; Advanced Engineering Materials; 5; No. 12; pp. 837-858; (2003).
Zeng et al. "Progress and Challenge for Magnesium Alloys as Biomaterials," Advanced Engineering Materials, vol. 10, Issue 8, Aug. 2008, pp. B3-B14.
International Search Report and Written Opinion; Mail Date Jul. 28, 2011; International Application No. PCT/US2010/057763; International Filing date Nov. 23, 2010; Korean Intellectual Property Office; International Search Report 7 pages; Written Opinion 3 pages.
International Search Report and Written Opinion for International application No. PCT/US2012/034973 filed on Apr. 25, 2012, mailed on Nov. 29, 2012.
Notification of Transmittal of the International Search Report and the Written Opinion of the International Searching Authority; PCT/US2011/047000; Korean Intellectual Property Office; Mailed Dec. 26, 2011; 8 pages.
Patent Cooperation Treaty International Search Report and Written Opinion for International Patent Application No. PCT/US2012/034978 filed on Apr. 25, 2012, mailed on Nov. 12, 2012.
Abdoulaye Seyni, Nadine Le Bolay, Sonia Molina-Boisseau, "On the interest of using degradable fillers in co-ground composite materials", Powder Technology 190, (2009) pp. 176-184.
CH. Christoglou, N. Voudouris, G.N. Angelopoulos, M. Pant, W. Dahl, "Deposition of Aluminum on Magnesium by a CVD Process", Surface and Coatings Technology 184 (2004) 149-155.
Constantin Vahlas, Bri Gitte Caussat, Philippe Serp, George N. Angelopoulos, "Principles and Applications of CVD Powder Technology", Materials Science and Engineering R 53 (2006) 1-72.
Yi Feng, Hailong Yuan, "Electroless Plating of Carbon Nanotubes with Silver" Journal of Materials Science, 39, (2004) pp. 3241-3243.
E. Flahaut et al., "Carbon Nanotube-Metal-Oxide Nanocomposites: Microstructure, Electrical Conductivity and Mechanical Properties" Acta mater. 48 (2000) 3803-3812.
C.S. Goh, J. Wei, L C Lee, and M. Gupta, "Development of novel carbon nanotube reinforced magnesium nanocomposites using the powder metallurgy technique", Nanotechnology 17 (2006) 7-12.

(56) References Cited

OTHER PUBLICATIONS

Guan Ling Song, Andrej Atrens "Corrosion Mechanisms of Magnesium Alloys", Advanced Engineering Materials 1999, 1, No. 1, pp. 11-33.
H. Hermawan, H. Alamdari, D. Mantovani and Dominique Dube, "Iron-manganese: new class of metallic degradable biomaterials prepared by powder metallurgy", Powder Metallurgy, vol. 51, No. 1, (2008), pp. 38-45.
J. Dutta Majumdar, B. Ramesh Chandra, B.L. Mordike, R. Galun, I. Manna, "Laser Surface Engineering of a Magnesium Alloy with Al + Al2O3", Surface and Coatings Technology 179 (2004) 297-305.
J.E. Gray, B. Luan, "Protective Coatings on Magnesium and Its Alloys—a Critical Review", Journal of Alloys and Compounds 336 (2002) 88-113.
Toru Kuzumaki, Osamu Ujiie, Hideki Ichinose, and Kunio Ito, "Mechanical Characteristics and Preparation of Carbon Nanotube Fiber-Reinforced Ti Composite", Advanced Engineering Materials, 2000, 2, No. 7.
Xiaowu Nie, Patents of Methods to Prepare Intermetallic Matrix Composites: A Review, Recent Patents on Materials Science 2008, 1, 232-240, Department of Scientific Research, Hunan Railway College of Science and Technology, Zhuzhou, P.R. China.
Shimizu et al., "Multi-walled carbon nanotube-reinforced magnesium alloy composites", Scripta Materialia, vol. 58, Issue 4, pp. 267-270.
Jing Sun, Lian Gao, Wei Li, "Colloidal Processing of Carbon Nanotube/Alumina Composites" Chem. Mater. 2002, 14, 5169-5172.
Xiaotong Wang et al., "Contact-Damage-Resistant Ceramic/Single-Wall Carbon Nanotubes and Ceramic/Graphite Composites" Nature Materials, vol. 3, Aug. 2004, pp. 539-544.
Y. Zhang and Hongjie Dai, "Formation of metal nanowires on suspended single-walled carbon nanotubes" Applied Physics Letter, vol. 77, No. 19 (2000), pp. 3015-3017.
Yihua Zhu, Chunzhong Li, Qiufang Wu, "The process of coating on ultrafine particles by surface hydrolysis reaction in a fluidized bed reactor", Surface and Coatings Technology 135 (2000) 14-17.
Guo-Dong Zhan, Joshua D. Kuntz, Julin Wan and Amiya K. Mukherjee, "Single-wall carbon nanotubes as attractive toughening agents in alumina-based nanocomposites" Nature Materials, vol. 2., Jan. 2003. 38-42.
Y. Zhang, Nathan W. Franklin, Robert J. Chen, Hongjie Dal, "Metal Coating on Suspended Carbon Nanotubes and its Implication to Metal-Tube Interaction", Chemical Physics Letters 331 (2000) 35-41.
Flow Control Systems, [online]; [retrieved on May 20, 2010]; retrieved from the Internet http://www.bakerhughes.com/products-and-services/completions-and-productions/well-completions/packers-and-flow-control/flow-control-systems.
Optisleeve Sliding Sleeve, [online]; [retrieved on Jun. 25, 2010]; retrieved from the Internet weatherford.com/weatherford/groups/.../weatherfordcorp/WFT033159.pdf.
"Sliding Sleeve", Omega Completion Technology Ltd, Sep. 29, 2009, retrieved on: www.omega-completion.com.
Welch, William R. et al., "Nonelastomeric Sliding Sleeve Maintains Long Term Integrity in HP/HT Application: Case Histories." [Abstract Only], SPE Eastern Regional Meeting, Oct. 23-25, 1996, Columbus. Ohio.
Notification of Transmittal of the International Search Report and the Written Opinion of the International Searching Authority, or the Declaration mailed on Feb. 23, 2012 (Dated Feb. 22, 2012) for PCT/US2011/043036.
ISR and Written Opinion for PCT/US2012/044866, dated Jan. 2, 2013.
ISR and Written Opinion of PCT/US2012/049434, Dated Feb. 1, 2013.
A. Elsayed et al., "Effect of Consolidation and Extrusion Temperatures on Tensile Properties of Hot Extruded ZK61 Magnesium Alloy Gas Atomized Powders via Spark Plasma Sintering" Transacation of JWRI, vol. 38, (2009) No. 2, pp. 31-35.
A. Maisano, "Cryomilling of Aluminum-Based and Magnesium-Based Metal Powders", Thesis, Virginia Tech, Jan. 13, 2006.
Ambat, et al.; "Electroless Nickel-Plating on AZ91D Magnesium Alloy: Effect of Substrate Microstructure and Plating Parameters"; Surface and Coatings Technology; 179; pp. 124-134; (2004).
B. Han, et al., "Mechanical Properties of Nanostructured Materials", Rev. Adv. Mater. Sci. 9(2005) 1-16.
Baker Oil Tools, "Z-Seal Metal-to-Metal Expandable Sealing Device Uses Expanding Metal in Place of Elastomers," Nov. 6, 2006.
L. Chun-Lin. "Design of Abrasive Water Jet Perforation and Hydraulic Fracturing Tool," Oil Field Equipment, Mar. 2011.
E.J. Lavernia, et al.,"Cryomilled Nanostructured Materials: Processing and Properties", Materials Science and Engineering A, 493, (2008) 207-214.
H. Watanabe, "Superplastic Deformation Mechanism in Powder Metallurgy Magnesium Alloys and Composites", Acta mater. 49 (2001) pp. 2027-2037.
H. Watarai, "Trend of Research and Development for Magnesium Alloys-Reducing the Weight of Structural Materials in Motor Vehicles", (2006) Science and Technology Trends, Quarterly Review No. 18, 84-97.
ISR and Written Opinion for PCT/US2011/058099, mailed on May 11, 2012.
ISR and Written Opinion of PCT/US2010/059257; Mailed Jul. 27, 2011.
J. Constantine, "Selective Production of Horizontal Openhole Completions Using ECP and Sliding Sleeve Technology," SPE Rocky Mountain Regional Meeting, May 15-18, 1999, Gillette, Wyoming. [Abstract Only].
M. Bououdina, et al., "Comparative Study of Mechanical Alloying of (Mg+Al) and (Mg+Al+Ni) Mixtures for Hydrogen Storage", J. Alloys, Compds, 2002, 336, 222-231.
M. Liu, et al "Calculated Phase Diagrams and the Corrosion of Die-Cast Mg—Al Alloys", Corrosion Science, 2009, 51, 606-619.
X. Nie, "Patents of Methods to Prepare Intermetallic Matrix Composites: A Review," Recent Patents on Materials Science 2008, vol. 1, pp. 232-240.
ISR and Written Opinion; PCT/US2012/038622; Date of Mailing Dec. 6, 2012; 12 pages.
S.L. Lee, et al., "Effects of Ni Addition on Hydrogen Storage Properties of Mg17AL12 Alloy", Materials Chemistry and Physics, 2011, 126, 319-324.
Shumbera et al., "Improved Water Injector Performance in a Gulf of Mexico Deepwater Development Using an Openhole Frac Pack Completion and Downhole Filter System: Case History," SPE Annual Technical Conference and Exhibition, Oct. 5-8, 2003, Denver, Colorado. [Abstract Only].
T.J. Bastow, et al., "Clustering and Formation of Nano-Precipitates in Dilute Aluminum and Magnesium Alloys", Materials Science and Engineering, 2003, C23, 757-762.
Vickery, et al., "New One-Trip Multi-Zone Frac Pack System with Positive Positioning," European Petroleum Conference, Oct. 29-31, 2002, Aberdeen, UK. [Abstract Only].
ISR and Written Opinion of PCT/US2011/058105 mailed on May 1, 2012.
ISR and Written Opinion for PCT/US2012/046231, mailed Jan. 29, 2013.
ISR and Written Opinion for PCT/US2012/034973, mailed on Nov. 29, 2012.
ISR and Written Opinion for PCT/US2012/034978, mailed on Nov. 12, 2012.
Wikipedia, the free encyclopedia. Reactivity series. http://en.wikipedia.org/w/index.php?title=Reactivity_series&printable=yes downloaded on May 18, 2014. 8 pages.
Garfield G., Baker Hughes Incoporated, New One-Trip Sand-Control Completion System that Eliminates Formation Damage Resulting From conventional Perforating and Gravel-Packing Operations:, SPE Annual Technical Conference and Exhibition, Oct. 9-12, 2005.
Garfield, Garry, McElfresh, P., Williams C. and Baker Hughes Incorporated, "Maximizing Inflow Performance in Soft Sand Completions Using New One-trip Sand Control Liner Completion Technology", SPE European Formation Damage Conference, May 25-27, 2005, SP.

(56) References Cited

OTHER PUBLICATIONS

Joel Shaw, "Benefits and Application of a Surface-Controlled Sliding Sleeve for Fracturing Operations"; Society of Petroleum Engineers, SPE Paper No. 147546; Oct. 30, 2011; 8 pages.
N. Birbilis, et al., "Exploring Corrosion Protection of Mg via Ionic Liquid Pretreatment", Surface & Coatings Technology; 201, pp. 4496-4504, (2007).
N. Carrejo et al., "Improving Flow Assurance in Multi-Zone Fracturing Treatments in Hydrocarben Reservoirs with High Strength Corrodible Tripping Balls"; Society of Petroleum Engineers; SPE Paper No. 151613; Apr. 16, 2012; 6 pages.
Y. Li et al., "Investigation of aluminium-based nancompsoites with ultra-high strength", Materials Science and Engineering A, 527, pp. 305-316, (2009).
H. Hermawan, et al., "Iron-manganese: new class of metallic degradable biomaterials prepared by powder metallurgy", Powder Metallurgy, vol. 51, No. 1, (2008), pp. 38-45.
Adams, et al.; "Thermal stabilities of aromatic acids as geothermal tracers", Geotherrnics, vol. 21, No. 3, 1992, pp. 323-339.
Ayman, et al.; "Effect of Consolidation and Extrusion Temperatures on Tensile Properties of Hot Extruded ZK61 Magnesium Alloy Gas Atomized Powders via Spark Plasma Sintering", Transactions of JWRI, vol. 38 (2009), No. 2, pp. 1-5.
International Search Report and Written Opinion; International Application No. PCT/US2012/053339; International Filing Date: Aug. 31, 2012; Date of Mailing: Feb. 15, 2013; 11 pages.
International Search Report and Written Opinion; International Application No. PCT/US2012/053342; International Filing Date: Aug. 31, 2012; Date of Mailing: Feb. 19, 2013; 9 pages.
International Search Report and Written Opinion; International Application No. PCT/US2012/053350; International Filing Date: Aug. 31, 2012; Date of Mailing: Feb. 25, 2013; 10 pages.
International Search Report and Written Opinion; International Application No. PCT/US2014/054720; International Filing Date: Sep. 9, 2014; Date of Mailing: Dec. 17, 2014; 10 pages.
Rose, et al.; "The application of the polyaromatic sulfonates as tracers in geothermal reservoirs", Geothermics 30 (2001) pp. 617-640.
Shigematsu, et al., "Surface Treatment of AZ91D Magnesium Alloy by Aluminum diffusion Coating", Journal of Materials Science Letters 19, 2000, pp. 473-475.
Singh, et al., "Extended Homogeneity Range of Intermetallic Phases in Mechanically Alloyed Mg-Al Alloys", Elsevier Sciences Ltd., Intemetallics 11, 2003, pp. 373-376.
Stanley, et al.; "An Introduction to Ground-Water Tracers", Department of Hydrology and Water Resources, University of Arizona, Mar. 1985, pp. 1-219.
Walters, et al.; "A Study of Jets from Unsintered-Powder Metal Lined Nonprecision Small-Caliber Shaped Charges", Army Research Laboratory, Aberdeen Proving Ground, MD 21005-5066; Feb. 2001.
Xu, et al., "Nanostructured Material-Based Completion Tools Enhance Well Productivity"; International Petroleum Technology Conference; Conference Paper IPTC 16538; International Petroleum Technology Conference 2013; 4 pages.
Zemel, "Tracers in the Oil Field", University of Texas at Austin, Center for Petroleum and Geosystems, Jan. 1995, Chapters 1, 2, 3, 7.
Zhang, et al.; "High Strength Nanostructured Materials and Their Oil Field Applications"; Society of Petroleum Engineers; Conference Paper SPE 157092; SPE International Oilfield Nanotechnology Conference, 2012; 6 pages.
Baker Hughes Incorporated. IN-Tallic Disintegrating Frac Balls. Houston: Baker Hughes Incorporated, 2011. Accessed Mar. 6, 2015.
Baker Hughes, "Multistage", Oct. 31, 2011, BakerHughes.com; accessed Mar. 6, 2015.
International Search Report and Written Opinion; International Application No. PCT/US2012/071742; International Filing Date: Oct. 3, 2014; Date of Mailing: Apr. 22, 2013; 12 pages.
International Search Report and Written Opinion; International Application No. PCT/US2014/058997, International Filing Date: Oct. 3, 2014; Date of Mailing: Jan. 12, 2015; 12 pages.
International Search Report; International Application No. PCT/US2012/044229, International Filing Date: Jun. 26, 2012; Date of Mailing; Jan. 30, 2013; 3 pp.
Murray, "Binary Alloy Phase Diagrams" Int. Met. Rev., 30(5) 1985 vol. 1, pp. 103-187.
Shigematsu, I. et al. "Surface treatment of AZ91D magnesium alloy by aluminum diffusion coating" Journal of Materials Science Letters 19 (2000) 473-475.
Vernon Constien et al., "Development of Reactive Coatings to Protect Sand-Control Screens", SPE 112494, Copyright 2008, Society of Petroleum Engineers, This paper was prepared for presentation at the 2008 SPE International Symposium and Exhibition on Formation Damage Control held in Layafette, Louisiana, U.S.A., Feb. 13-15, 2008.

* cited by examiner

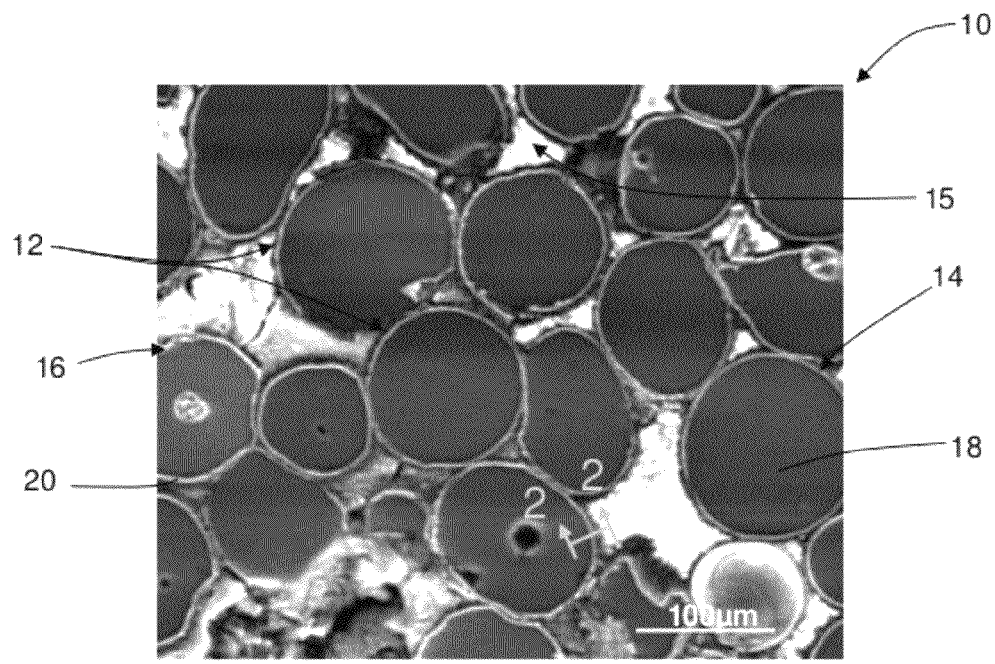
FIG. 1
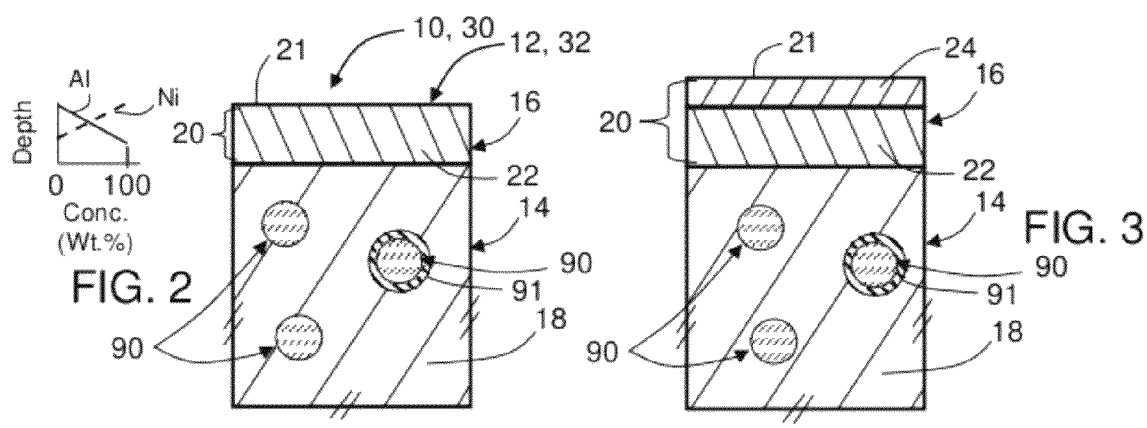
FIG. 2
FIG. 3
FIG. 4
FIG. 5

NANOMATRIX POWDER METAL COMPOSITE

CROSS REFERENCE TO RELATED APPLICATIONS

This application contains subject matter related to the subject matter of the following co-pending applications: U.S. patent application Ser. Nos. 12/633,682; 12/633,686; 12/633,688; 12/633,678; 12/633,683; 12/633,662; 12/633,677; and 12/633,668 that were all filed on Dec. 8, 2009; 12/847,594 that was filed on Jul. 30, 2010, which are assigned to the same assignee as this application, Baker Hughes Incorporated of Houston, Tex.; and which are incorporated herein by reference in their entirety.

BACKGROUND

Oil and natural gas wells often utilize wellbore components or tools that, due to their function, are only required to have limited service lives that are considerably less than the service life of the well. After a component or tool service function is complete, it must be removed or disposed of in order to recover the original size of the fluid pathway for use, including hydrocarbon production, $CO_2$ sequestration, etc. Disposal of components or tools has conventionally been done by milling or drilling the component or tool out of the wellbore, which are generally time consuming and expensive operations.

In order to eliminate the need for milling or drilling operations, the removal of components or tools by dissolution of degradable polylactic polymers using various wellbore fluids has been proposed. However, these polymers generally do not have the mechanical strength, fracture toughness and other mechanical properties necessary to perform the functions of wellbore components or tools over the operating temperature range of the wellbore, therefore, their application has been limited.

Other degradable materials have been proposed including certain degradable metal alloys formed from certain reactive metals in a major portion, such as aluminum, together with other alloy constituents in a minor portion, such as gallium, indium, bismuth, tin and mixtures and combinations thereof, and without excluding certain secondary alloying elements, such as zinc, copper, silver, cadmium, lead, and mixtures and combinations thereof. These materials may be formed by melting powders of the constituents and then solidifying the melt to form the alloy. They may also be formed using powder metallurgy by pressing, compacting, sintering and the like a powder mixture of a reactive metal and other alloy constituent in the amounts mentioned. These materials include many combinations that utilize metals, such as lead, cadmium, and the like that may not be suitable for release into the environment in conjunction with the degradation of the material. Also, their formation may involve various melting phenomena that result in alloy structures that are dictated by the phase equilibria and solidification characteristics of the respective alloy constituents, and that may not result in optimal or desirable alloy microstructures, mechanical properties or dissolution characteristics.

Therefore, the development of materials that can be used to form wellbore components and tools having the mechanical properties necessary to perform their intended function and then removed from the wellbore by controlled dissolution using wellbore fluids is very desirable.

SUMMARY

An exemplary embodiment of a powder metal composite is disclosed. The powder metal composite includes a substantially-continuous, cellular nanomatrix comprising a nanomatrix material. The compact also includes a plurality of dispersed particles comprising a particle core material that comprises Mg, Al, Zn or Mn, or a combination thereof, dispersed in the nanomatrix, the core material of the dispersed particles comprising a plurality of distributed carbon nanoparticles, and a bond layer extending throughout the nanomatrix between the dispersed particles.

Another exemplary embodiment of a powder metal composite is also disclosed. The powder metal composite includes a substantially-continuous, cellular nanomatrix comprising a nanomatrix material. The compact also includes a plurality of dispersed particles comprising a particle core material that comprises a metal having a standard oxidation potential less than Zn, ceramic, glass or carbon, or a combination thereof, dispersed in the nanomatrix, the core material of the dispersed particles comprising a plurality of distributed carbon nanoparticles and a bond layer extending throughout the nanomatrix between the dispersed particles.

BRIEF DESCRIPTION OF THE DRAWINGS

Referring now to the drawings wherein like elements are numbered alike in the several Figures:

FIG. 1 is a photomicrograph of a powder 10 as disclosed herein that has been embedded in an epoxy specimen mounting material and sectioned;

FIG. 2 is a schematic illustration of an exemplary embodiment of a powder particle 12 as it would appear in an exemplary section view represented by section 2-2 of FIG. 1;

FIG. 3 is a schematic illustration of a second exemplary embodiment of a powder particle 12 as it would appear in a second exemplary section view represented by section 2-2 of FIG. 1;

FIG. 4 is a schematic illustration of a third exemplary embodiment of a powder particle 12 as it would appear in a third exemplary section view represented by section 2-2 of FIG. 1;

FIG. 5 is a schematic illustration of a fourth exemplary embodiment of a powder particle 12 as it would appear in a fourth exemplary section view represented by section 2-2 of FIG. 1;

DETAILED DESCRIPTION

Figure 6:
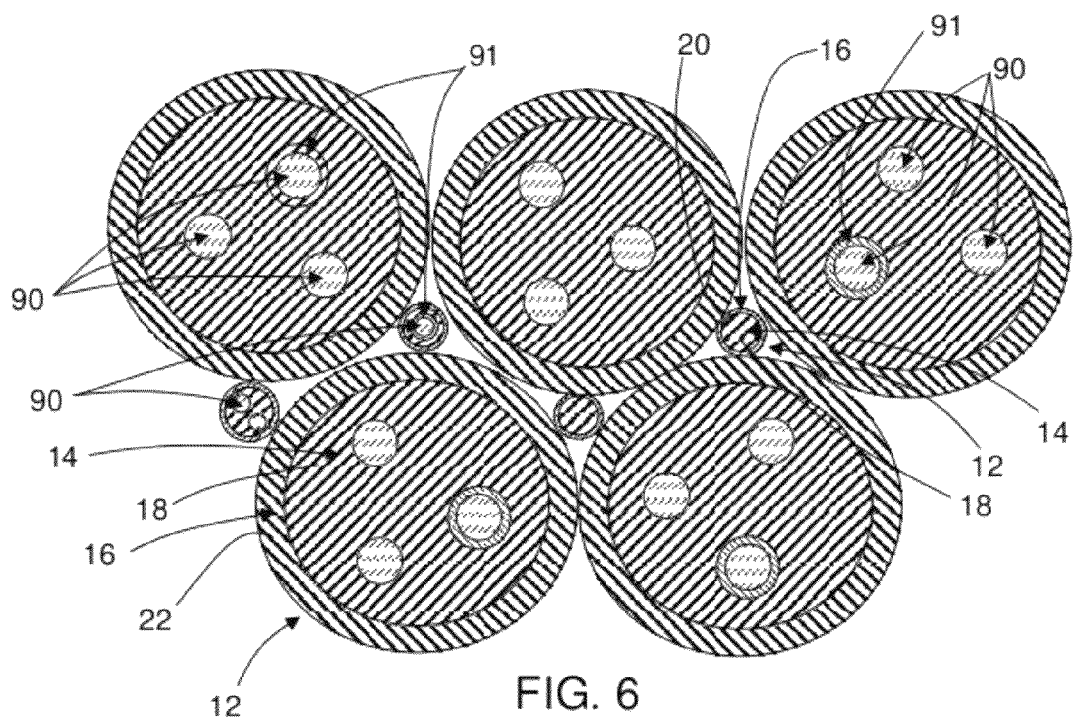
FIG. 6 is a schematic illustration of a second exemplary embodiment of a powder as disclosed herein having a multi-modal distribution of particle sizes.

Lightweight, high-strength metallic materials are disclosed that may be used in a wide variety of applications and application environments, including use in various wellbore environments to make various selectably and controllably disposable or degradable lightweight, high-strength downhole tools or other downhole components, as well as many other applications for use in both durable and disposable or degradable articles. These lightweight, high-strength and selectably and controllably degradable materials include fully-dense, sintered powder compacts formed from coated powder materials that include various lightweight particle cores and core materials having various single layer and multilayer nanoscale coatings. These powder compacts are made from coated metallic powders that include various electrochemically-active (e.g., having relatively higher standard oxidation potentials) lightweight, high-strength particle cores and core materials, such as electrochemically active metals, that are dispersed as dispersed particles within a cellular nanomatrix formed from the various nanoscale metallic coating layers of metallic coating materials, and are particularly useful in wellbore applications. The core material of the dispersed particles also includes a plurality of distributed carbon nanoparticles. These powder compacts provide a unique and advantageous combination of mechanical strength properties, such as compression and shear strength, low density and selectable and controllable corrosion properties, particularly rapid and controlled dissolution in various wellbore fluids. For example, the particle core and coating layers of these powders may be selected to provide sintered powder compacts suitable for use as high strength engineered materials having a compressive strength and shear strength comparable to various other engineered materials, including carbon, stainless and alloy steels, but which also have a low density comparable to various polymers, elastomers, low-density porous ceramics and composite materials. As yet another example, these powders and powder compact materials may be configured to provide a selectable and controllable degradation or disposal in response to a change in an environmental condition, such as a transition from a very low dissolution rate to a very rapid dissolution rate in response to a change in a property or condition of a wellbore proximate an article formed from the compact, including a property change in a wellbore fluid that is in contact with the powder compact. The selectable and controllable degradation or disposal characteristics described also allow the dimensional stability and strength of articles, such as wellbore tools or other components, made from these materials to be maintained until they are no longer needed, at which time a predetermined environmental condition, such as a wellbore condition, including wellbore fluid temperature, pressure or pH value, may be changed to promote their removal by rapid dissolution. These coated powder materials and powder compacts and engineered materials formed from them, as well as methods of making them, are described further below. The distributed carbon nanoparticles provide further strengthening of the core material of the dispersed particles, thereby providing enhanced strengthening of the powder compact as compared, for example, to powder compacts having dispersed particles that do not include them. Also, the density of certain distributed carbon nanoparticles may be lower than the dispersed metal particle core materials, thereby enabling powder compact materials with a lower density, as compared, for example, to powder compacts having dispersed particle cores that do not include them. Thus, the use of distributed carbon nanoparticles in nanomatrix metal composite compacts may provide materials having even higher strength to weight ratios than nanomatrix metal compacts that do not include the distributed carbon nanoparticles.

Referring to FIGS. 1-5, a metallic powder 10 includes a plurality of metallic, coated powder particles 12. Powder particles 12 may be formed to provide a powder 10, including free-flowing powder, that may be poured or otherwise disposed in all manner of forms or molds (not shown) having all manner of shapes and sizes and that may be used to fashion precursor powder compacts 100 (FIG. 16) and powder compacts 200 (FIGS. 10-15), as described herein, that may be used as, or for use in manufacturing, various articles of manufacture, including various wellbore tools and components.

Each of the metallic, coated powder particles 12 of powder 10 includes a particle core 14 and a metallic coating layer 16 disposed on the particle core 14. The particle core 14 includes a core material 18. The core material 18 may include any suitable material for forming the particle core 14 that provides powder particle 12 that can be sintered to form a lightweight, high-strength powder compact 200 having selectable and controllable dissolution characteristics. Suitable core materials include electrochemically active metals having a standard oxidation potential greater than or equal to that of Zn, including as Mg, Al, Mn or Zn or a combination thereof. These electrochemically active metals are very reactive with a number of common wellbore fluids, including any number of ionic fluids or highly polar fluids, such as those that contain various chlorides. Examples include fluids comprising potassium chloride (KCl), hydrochloric acid (HCl), calcium chloride ($CaCl_2$), calcium bromide ($CaBr_2$) or zinc bromide ($ZnBr_2$). Core material 18 may also include other metals that are less electrochemically active than Zn or non-metallic materials, or a combination thereof. Suitable non-metallic materials include ceramics, composites or glasses. The core material 18 includes a plurality of distributed carbon nanoparticles 90 as described herein. As used herein, at least some of the powder particles 12 of powder 10 will include particle cores 14 having core material 18 that includes a plurality of distributed carbon nanoparticles 90. Thus, a plurality of distributed carbon nanoparticles 90 may be present in each of powder particles 12, or only a portion of powder particles 12. Further, while in one embodiment the powder particles 12 that include distributed carbon nanoparticles 90 include a plurality of them, it is also possible to distribute a single carbon nanoparticle 90 within particle core 14. Core material 18 may be selected to provide a high dissolution rate in a predetermined wellbore fluid, but may also be selected to provide a relatively low dissolution rate, including zero dissolution, where dissolution of the nanomatrix material causes the particle core 14 to be rapidly undermined and liberated from the particle compact at the interface with the wellbore fluid, such that the effective rate of dissolution of particle compacts made using particle cores 14 of these core materials 18 is high, even though core material 18 itself may have a low dissolution rate, including core materials 20 that may be substantially insoluble in the wellbore fluid.

With regard to the electrochemically active metals as core materials 18, including Mg, Al, Mn or Zn, these metals may be used as pure metals or in any combination with one another, including various alloy combinations of these materials, including binary, tertiary, or quaternary alloys of these materials. These combinations may also include composites of these materials. Further, in addition to combinations with one another, the Mg, Al, Mn or Zn core materials 18 may also include other constituents, including various alloying additions, to alter one or more properties of the particle cores 14, such as by improving the strength, lowering the density or altering the dissolution characteristics of the core material 18.

Among the electrochemically active metals, Mg, either as a pure metal or an alloy or a composite material, is particularly useful, because of its low density and ability to form high-strength alloys, as well as its high degree of electrochemical activity, since it has a standard oxidation potential higher than Al, Mn or Zn. Mg alloys include all alloys that have Mg as an alloy constituent. Mg alloys that combine other electrochemically active metals, as described herein, as alloy constituents are particularly useful, including binary Mg—Zn, Mg—Al and Mg—Mn alloys, as well as tertiary Mg—Zn—Y and Mg—Al—X alloys, where X includes Zn, Mn, Si, Ca or Y, or a combination thereof. These Mg—Al—X alloys may include, by weight, up to about 85% Mg, up to about 15% Al and up to about 5% X. Particle core 14 and core material 18, and particularly electrochemically active metals including Mg, Al, Mn or Zn, or combinations thereof, may also include a rare earth element or combination of rare earth elements. As used herein, rare earth elements include Sc, Y, La, Ce, Pr, Nd or Er, or a combination of rare earth elements. Where present, a rare earth element or combinations of rare earth elements may be present, by weight, in an amount of about 5% or less.

Particle core 14 and core material 18, including distributed carbon nanoparticles 90, have a melting temperature ($T_P$). As used herein, $T_P$ includes the lowest temperature at which incipient melting or liquation or other forms of partial melting occur within core material 18, regardless of whether core material 18 comprises a pure metal, an alloy with multiple phases having different melting temperatures or a composite of materials having different melting temperatures.

Particle cores 14 may have any suitable particle size or range of particle sizes or distribution of particle sizes. For example, the particle cores 14 may be selected to provide an average particle size that is represented by a normal or Gaussian type unimodal distribution around an average or mean, as illustrated generally in FIG. 1. In another example, particle cores 14 may be selected or mixed to provide a multimodal distribution of particle sizes, including a plurality of average particle core sizes, such as, for example, a homogeneous bimodal distribution of average particle sizes, as illustrated generally and schematically in FIG. 6. The selection of the distribution of particle core size may be used to determine, for example, the particle size and interparticle spacing 15 of the particles 12 of powder 10. In an exemplary embodiment, the particle cores 14 may have a unimodal distribution and an average particle diameter of about 5 μm to about 300 μm, more particularly about 80 μm to about 120 μm, and even more particularly about 100 μm.

Particle cores 14 may have any suitable particle shape, including any regular or irregular geometric shape, or combination thereof. In an exemplary embodiment, particle cores 14 are substantially spheroidal electrochemically active metal particles. In another exemplary embodiment, particle cores 14 are ceramic particles, including regularly and irregularly shaped ceramic particles. In yet another exemplary embodiment, particle cores 14 are hollow glass microspheres.

The particle cores 14 of metallic coated powder particles 12 of powder 10 also include a plurality of distributed carbon nanoparticles 90 dispersed within the core material 18. Distributed carbon nanoparticles 90 may include nanoparticles of any suitable allotrope of carbon. Suitable allotropes include nanoparticles of diamond (nanodiamond); graphite, including various graphenes; fullerenes, including various buckyballs, buckyball clusters, nanobuds or nanotubes, and including single-wall or multi-wall nanotubes; amorphous carbon; glassy carbon; carbon nanofoam; lonsdaleite; or chaoite, or a combination thereof. Distributed carbon nanoparticles 90 may have any suitable nanoparticle shape or size. As used herein, a nanoparticle may include various regular and irregular particle shapes, including planar, spheroidal, ellipsoidal and tubular or cylindrical shapes, having at least one particle dimension of about 100 nm or less, and more particularly at least one particle dimension that is between about 0.1 nm to about 100 nm, and more particularly about 1.0 nm to about 100 nm. Distributed carbon nanoparticles 90 may also include metallized nanoparticles having a metal disposed thereon, such as, for example, a metal layer disposed on an outer surface of the carbon nanoparticle. Suitable carbon nanoparticles include various graphenes; fullerenes or nanodiamonds, or a combination thereof. Suitable fullerenes may include buckyballs, buckyball clusters, buckeypapers, nanobuds or nanotubes, including single-wall nanotubes and multi-wall nanotubes. Fullerenes may also include three-dimensional polymers of any of the above. Suitable fullerenes may also include metallofullerenes, or those fullerenes that encompass various metals or metal ions.

Fullerenes in the form of substantially spheroidal hollow polyhedrons or buckyballs, as disclosed herein, may include any of the known cage-like hollow allotropic forms of carbon possessing a polyhedral structure. Buckyballs may include, for example, from about 20 to about 100 carbon atoms. For example, $C_{60}$ is a fullerene having 60 carbon atoms and high symmetry ($D_{5h}$), and is a relatively common, commercially available fullerene. Exemplary fullerenes include, for example, $C_{30}$, $C_{32}$, $C_{34}$, $C_{38}$, $C_{40}$, $C_{42}$, $C_{44}$, $C_{46}$, $C_{48}$, $C_{50}$, $C_{52}$, $C_{60}$, $C_{70}$, $C_{76}$, or $C_{84}$ and the like, or combinations thereof. Buckyballs or buckyball clusters may include any suitable ball size or diameter, including substantially spheroidal configurations having any number of carbon atoms.

Nanotubes are carbon based, tubular or cylindrical fullerene structures having open or closed ends, which may be inorganic or made entirely or partially of carbon, and may include also other elements such as metals or metalloids. Both single-wall and multi-wall nanotubes are substantially cylindrical may have any predetermined tube length or tube diameter, or combination thereof. Multi-wall nanotubes may have any predetermined number of walls.

Nanographite is a cluster of plate-like sheets of graphite, in which a stacked structure of one or more layers of the graphite, which has a plate-like two dimensional structure of fused hexagonal rings with an extended delocalized π-electron system, layered and weakly bonded to one another through π-π stacking interaction. Graphene in general, and including nanographene, may be a single sheet or several sheets of graphite having nano-scale dimensions, such as an average particle size of (average largest dimension) of less than about, for example, 500 nm, or in other embodiments may have an average largest dimension greater than about 1 μm. Nanographene may be prepared by exfoliation of nanographite or by catalytic bond-breaking of a series of carbon-carbon bonds in a carbon nanotube to form a nanographene ribbon by an "unzipping" process, followed by derivatization of the nanographene to prepare, for example, nanographene oxide. Graphene nanoparticles may be of any suitable predetermined planar size, including any predetermined length or predetermined width, and thus may include any predetermined number of carbon atoms.

The nanodiamonds used herein may be from a naturally occurring source, such as a by-product of milling or other processing of natural diamonds, or may be synthetic, prepared by any suitable commercial method such as, but not limited to, high-pressure high-temperature (HPHT), explosive shock (also referred to as detonation, abbreviated DTD), chemical vapor deposition (CVD), physical vapor deposition (PVD), ultrasonic cavitation, and the like. Nanodiamonds may be used as received, or may be sorted and cleaned by various methods to remove contaminants and non-diamond carbon phases that may be present, such as residues of amorphous carbon or graphite. Nanodiamonds may be monocrystalline or polycrystalline. Nanodiamonds may include various regular and irregular shapes, including substantially spheroidal shapes. The nanodiamonds may be monodisperse, where all particles are of the same size with little variation, or polydisperse, where the particles have a range of sizes and are averaged. Generally, polydisperse nanodiamonds are used. Nanodiamonds of different average particle size may be used, and in this way, the particle size distribution of the nanodiamonds may be unimodal (exhibiting a single distribution), bimodal exhibiting two distributions, or multi-modal, exhibiting more than one particle size distribution, as described herein.

Distributed carbon nanoparticles 90 may be distributed either homogeneously or heterogeneously within core material 18. For example, in an exemplary embodiment of a homogeneous distribution a plurality of the same type of carbon nanoparticles, including those having the same size and shape may be distributed or dispersed uniformly within each of the particle cores 14 and throughout the core material 18 thereof. In another exemplary embodiment of a heterogeneous distribution, a plurality of different types of carbon nanoparticles, including those having a different size, shape, or both, may be distributed uniformly or non-uniformly within each of the particle cores 14 and throughout the core material 18 thereof. In another exemplary embodiment of a heterogeneous distribution, distributed carbon nanoparticles 90 may be distributed preferentially (e.g., in a higher volumetric concentration), for example, around a periphery of the particle core 14, or toward the interior of the particle core 14.

The distributed carbon nanoparticles 90 may be used in any suitable relative amount of the particle core 14 in which they are distributed, whether by weight, volume or atom percent. In an exemplary embodiment, the distributed carbon nanoparticles 92 may include about 20 percent or less by weight, and more particularly about 10 percent or less by weight, and even more particularly about 5 percent or less by weight.

Each of the metallic, coated powder particles 12 of powder 10 also includes a metallic coating layer 16 that is disposed on particle core 14. Metallic coating layer 16 includes a metallic coating material 20. Metallic coating material 20 gives the powder particles 12 and powder 10 its metallic nature. Metallic coating layer 16 is a nanoscale coating layer. In an exemplary embodiment, metallic coating layer 16 may have a thickness of about 25 nm to about 2500 nm. The thickness of metallic coating layer 16 may vary over the surface of particle core 14, but will preferably have a substantially uniform thickness over the surface of particle core 14. Metallic coating layer 16 may include a single layer, as illustrated in FIG. 2, or a plurality of layers as a multilayer coating structure, as illustrated in FIGS. 3-5 for up to four layers. In a single layer coating, or in each of the layers of a multilayer coating, the metallic coating layer 16 may include a single constituent chemical element or compound, or may include a plurality of chemical elements or compounds. Where a layer includes a plurality of chemical constituents or compounds, they may have all manner of homogeneous or heterogeneous distributions, including a homogeneous or heterogeneous distribution of metallurgical phases. This may include a graded distribution where the relative amounts of the chemical constituents or compounds vary according to respective constituent profiles across the thickness of the layer. In both single layer and multilayer coatings 16, each of the respective layers, or combinations of them, may be used to provide a predetermined property to the powder particle 12 or a sintered powder compact formed therefrom. For example, the predetermined property may include the bond strength of the metallurgical bond between the particle core 14 and the coating material 20; the interdiffusion characteristics between the particle core 14 and metallic coating layer 16, including any interdiffusion between the layers of a multilayer coating layer 16; the interdiffusion characteristics between the various layers of a multilayer coating layer 16; the interdiffusion characteristics between the metallic coating layer 16 of one powder particle and that of an adjacent powder particle 12; the bond strength of the metallurgical bond between the metallic coating layers of adjacent sintered powder particles 12, including the outermost layers of multilayer coating layers; and the electrochemical activity of the coating layer 16.

Metallic coating layer 16 and coating material 20 have a melting temperature ($T_C$). As used herein, $T_C$ includes the lowest temperature at which incipient melting or liquation or other forms of partial melting occur within coating material 20, regardless of whether coating material 20 comprises a pure metal, an alloy with multiple phases each having different melting temperatures or a composite, including a composite comprising a plurality of coating material layers having different melting temperatures.

Metallic coating material 20 may include any suitable metallic coating material 20 that provides a sinterable outer surface 21 that is configured to be sintered to an adjacent powder particle 12 that also has a metallic coating layer 16 and sinterable outer surface 21. In powders 10 that also include second or additional (coated or uncoated) particles 32, as described herein, the sinterable outer surface 21 of metallic coating layer 16 is also configured to be sintered to a sinterable outer surface 21 of second particles 32. In an exemplary embodiment, the powder particles 12 are sinterable at a predetermined sintering temperature ($T_S$) that is a function of the core material 18 and coating material 20, such that sintering of powder compact 200 is accomplished entirely in the solid state and where $T_S$ is less than $T_P$ and $T_C$. Sintering in the solid state limits particle core 14/metallic coating layer 16 interactions to solid state diffusion processes and metallurgical transport phenomena and limits growth of and provides control over the resultant interface between them. In contrast, for example, the introduction of liquid phase sintering would provide for rapid interdiffusion of the particle core 14/metallic coating layer 16 materials and make it difficult to limit the growth of and provide control over the resultant interface between them, and thus interfere with the formation of the desirable microstructure of particle compact 200 as described herein.

In an exemplary embodiment, core material 18 will be selected to provide a core chemical composition and the coating material 20 will be selected to provide a coating chemical composition and these chemical compositions will also be selected to differ from one another. In another exemplary embodiment, the core material 18 will be selected to provide a core chemical composition and the coating material 20 will be selected to provide a coating chemical composition and these chemical compositions will also be selected to differ from one another at their interface. Differences in the chemical compositions of coating material 20 and core material 18, including distributed carbon nanoparticles 90, may be selected to provide different dissolution rates and selectable and controllable dissolution of powder compacts 200 that incorporate them making them selectably and controllably dissolvable. This includes dissolution rates that differ in response to a changed condition in the wellbore, including an indirect or direct change in a wellbore fluid. In an exemplary embodiment, a powder compact 200 formed from powder 10 having chemical compositions of core material 18 and coating material 20 that make compact 200 selectably dissolvable in a wellbore fluid in response to a changed wellbore condition that includes a change in temperature, change in pressure, change in flow rate, change in pH or change in chemical composition of the wellbore fluid, or a combination thereof. The selectable dissolution response to the changed condition may result from actual chemical reactions or processes that promote different rates of dissolution, but also encompass changes in the dissolution response that are associated with physical reactions or processes, such as changes in wellbore fluid pressure or flow rate.

In an exemplary embodiment of a powder 10, particle core 14 includes Mg, Al, Mn or Zn, or a combination thereof, as core material 18, and more particularly may include pure Mg and Mg alloys, and metallic coating layer 16 includes Al, Zn, Mn, Mg, Mo, W, Cu, Fe, Si, Ca, Co, Ta, Re, or Ni, or an oxide, nitride or a carbide thereof, or a combination of any of the aforementioned materials as coating material 20.

In another exemplary embodiment of powder 10, particle core 14 includes Mg, Al, Mn or Zn, or a combination thereof, as core material 18, and more particularly may include pure Mg and Mg alloys, and metallic coating layer 16 includes a single layer of Al or Ni, or a combination thereof, as coating material 20, as illustrated in FIG. 2. Where metallic coating layer 16 includes a combination of two or more constituents, such as Al and Ni, the combination may include various graded or co-deposited structures of these materials where the amount of each constituent, and hence the composition of the layer, varies across the thickness of the layer, as also illustrated in FIG. 2.

In yet another exemplary embodiment, particle core 14 includes Mg, Al, Mn or Zn, or a combination thereof, as core material 18, and more particularly may include pure Mg and Mg alloys, and coating layer 16 includes two layers as core material 20, as illustrated in FIG. 3. The first layer 22 is disposed on the surface of particle core 14 and includes Al or Ni, or a combination thereof, as described herein. The second layer 24 is disposed on the surface of the first layer and includes Al, Zn, Mg, Mo, W, Cu, Fe, Si, Ca, Co, Ta, Re or Ni, or a combination thereof, and the first layer has a chemical composition that is different than the chemical composition of the second layer. In general, first layer 22 will be selected to provide a strong metallurgical bond to particle core 14 and to limit interdiffusion between the particle core 14 and coating layer 16, particularly first layer 22. Second layer 24 may be selected to increase the strength of the metallic coating layer 16, or to provide a strong metallurgical bond and promote sintering with the second layer 24 of adjacent powder particles 12, or both. In an exemplary embodiment, the respective layers of metallic coating layer 16 may be selected to promote the selective and controllable dissolution of the coating layer 16 in response to a change in a property of the wellbore, including the wellbore fluid, as described herein. However, this is only exemplary and it will be appreciated that other selection criteria for the various layers may also be employed. For example, any of the respective layers may be selected to promote the selective and controllable dissolution of the coating layer 16 in response to a change in a property of the wellbore, including the wellbore fluid, as described herein. Exemplary embodiments of a two-layer metallic coating layers 16 for use on particles cores 14 comprising Mg include first/second layer combinations comprising Al/Ni and Al/W.

In still another embodiment, particle core 14 includes Mg, Al, Mn or Zn, or a combination thereof, as core material 18, and more particularly may include pure Mg and Mg alloys, and coating layer 16 includes three layers, as illustrated in FIG. 4. The first layer 22 is disposed on particle core 14 and may include Al or Ni, or a combination thereof. The second layer 24 is disposed on first layer 22 and may include Al, Zn, Mg, Mo, W, Cu, Fe, Si, Ca, Co, Ta, Re or Ni, or an oxide, nitride or a carbide thereof, or a combination of any of the aforementioned second layer materials. The third layer 26 is disposed on the second layer 24 and may include Al, Mn, Fe, Co, Ni or a combination thereof. In a three-layer configuration, the composition of adjacent layers is different, such that the first layer has a chemical composition that is different than the second layer, and the second layer has a chemical composition that is different than the third layer. In an exemplary embodiment, first layer 22 may be selected to provide a strong metallurgical bond to particle core 14 and to limit interdiffusion between the particle core 14 and coating layer 16, particularly first layer 22. Second layer 24 may be selected to increase the strength of the metallic coating layer 16, or to limit interdiffusion between particle core 14 or first layer 22 and outer or third layer 26, or to promote adhesion and a strong metallurgical bond between third layer 26 and first layer 22, or any combination of them. Third layer 26 may be selected to provide a strong metallurgical bond and promote sintering with the third layer 26 of adjacent powder particles 12. However, this is only exemplary and it will be appreciated that other selection criteria for the various layers may also be employed. For example, any of the respective layers may be selected to promote the selective and controllable dissolution of the coating layer 16 in response to a change in a property of the wellbore, including the wellbore fluid, as described herein. An exemplary embodiment of a three-layer coating layer for use on particles cores comprising Mg include first/second/third layer combinations comprising Al/Al$_2$O$_3$/Al.

In still another embodiment, particle core 14 includes Mg, Al, Mn or Zn, or a combination thereof, as core material 18, and more particularly may include pure Mg and Mg alloys, and coating layer 16 includes four layers, as illustrated in FIG. 5. In the four layer configuration, the first layer 22 may include Al or Ni, or a combination thereof, as described herein. The second layer 24 may include Al, Zn, Mg, Mo, W, Cu, Fe, Si, Ca, Co, Ta, Re or Ni or an oxide, nitride, carbide thereof, or a combination of the aforementioned second layer materials. The third layer 26 may also include Al, Zn, Mg, Mo, W, Cu, Fe, Si, Ca, Co, Ta, Re or Ni, or an oxide, nitride or carbide thereof, or a combination of any of the aforementioned third layer materials. The fourth layer 28 may include Al, Mn, Fe, Co, Ni or a combination thereof. In the four layer configuration, the chemical composition of adjacent layers is different, such that the chemical composition of first layer 22 is different than the chemical composition of second layer 24, the chemical composition is of second layer 24 different than the chemical composition of third layer 26, and the chemical composition of third layer 26 is different than the chemical composition of fourth layer 28. In an exemplary embodiment, the selection of the various layers will be similar to that described for the three-layer configuration above with regard to the inner (first) and outer (fourth) layers, with the second and third layers available for providing enhanced interlayer adhesion, strength of the overall metallic coating layer 16, limited interlayer diffusion or selectable and controllable dissolution, or a combination thereof. However, this is only exemplary and it will be appreciated that other selection criteria for the various layers may also be employed. For example, any of the respective layers may be selected to promote the selective and controllable dissolution of the coating layer 16 in response to a change in a property of the wellbore, including the wellbore fluid, as described herein.

The thickness of the various layers in multi-layer configurations may be apportioned between the various layers in any manner so long as the sum of the layer thicknesses provide a nanoscale coating layer 16, including layer thicknesses as described herein. In one embodiment, the first layer 22 and outer layer (24, 26, or 28 depending on the number of layers) may be thicker than other layers, where present, due to the desire to provide sufficient material to promote the desired bonding of first layer 22 with the particle core 14, or the bonding of the outer layers of adjacent powder particles 12, during sintering of powder compact 200.

Figure 7:
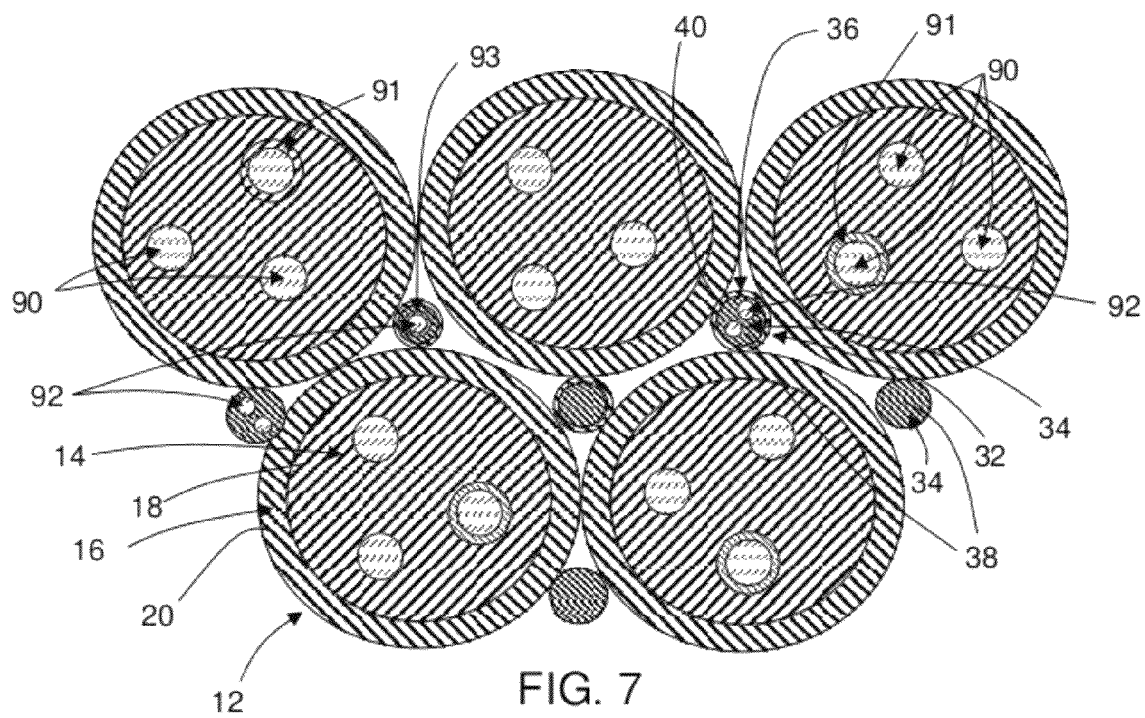
FIG. 7 is a schematic illustration of a third exemplary embodiment of a powder as disclosed herein having a multi-modal distribution of particle sizes.

Powder 10 may also include an additional or second powder 30 interspersed in the plurality of powder particles 12, as illustrated in FIG. 7. In an exemplary embodiment, the second powder 30 includes a plurality of second powder particles 32. These second powder particles 32 may be selected to change a physical, chemical, mechanical or other property of a powder particle compact 200 formed from powder 10 and second powder 30, or a combination of such properties. In an exemplary embodiment, the property change may include an increase in the compressive strength of powder compact 200 formed from powder 10 and second powder 30. In another exemplary embodiment, the second powder 30 may be selected to promote the selective and controllable dissolution of in particle compact 200 formed from powder 10 and second powder 30 in response to a change in a property of the wellbore, including the wellbore fluid, as described herein. Second powder particles 32 may be uncoated or coated with a metallic coating layer 36. When coated, including single layer or multilayer coatings, the coating layer 36 of second powder particles 32 may comprise the same coating material 40 as coating material 20 of powder particles 12, or the coating material 40 may be different. The second powder particles 32 (uncoated) or particle cores 34 may include any suitable material to provide the desired benefit, including many metals. The core material of second powder particles 32 (uncoated) or particle cores 34 may also include a plurality of dispersed second carbon nanoparticles 92 dispersed as described herein. Second distributed carbon nanoparticles 92 may be any of those described herein, and may be the same nanoparticles and distribution as the first carbon nanoparticles, or different nanoparticles, or a different distribution, or both. Analogous to first carbon nanoparticles 90, second carbon nanoparticles 92 may also may include a metal layer 93 disposed thereon. The composition of metal layer 93 may be selected to include the same composition as second core material 38 to improve intermixing of the second carbon nanoparticles 92 into the melt, or may be selected to have a composition that is different from second core material 38, and may be selected to alloy and intermix with second core material 38, or to avoid intermixing and alloying with second core material 38, for example. Metal layer 93 may also be disposed on second carbon nanoparticle 92 by any suitable method, including various chemical or physical deposition methods, and more particularly including plating, chemical vapor deposition or physical vapor deposition methods, and even more particularly by various FBCVD methods. In an exemplary embodiment, when coated powder particles 12 comprising Mg, Al, Mn or Zn, or a combination thereof are employed, suitable second powder particles 32 may include Ni, W, Cu, Co or Fe, or a combination thereof. Since second powder particles 32 will also be configured for solid state sintering to powder particles 12 at the predetermined sintering temperature ($T_S$), particle cores 34, including any distributed second carbon nanoparticles 92, will have a melting temperature $T_{AP}$ and any coating layers 36 will have a second melting temperature $T_{AC}$, where $T_S$ is less than $T_{AP}$ and $T_{AC}$. It will also be appreciated that second powder 30 is not limited to one additional powder particle 32 type (i.e., a second powder particle), but may include a plurality of additional powder particles 32 (i.e., second, third, fourth, etc. types of additional powder particles 32) in any number, and each of them may also include distributed second carbon nanoparticles 92.

Figure 8:
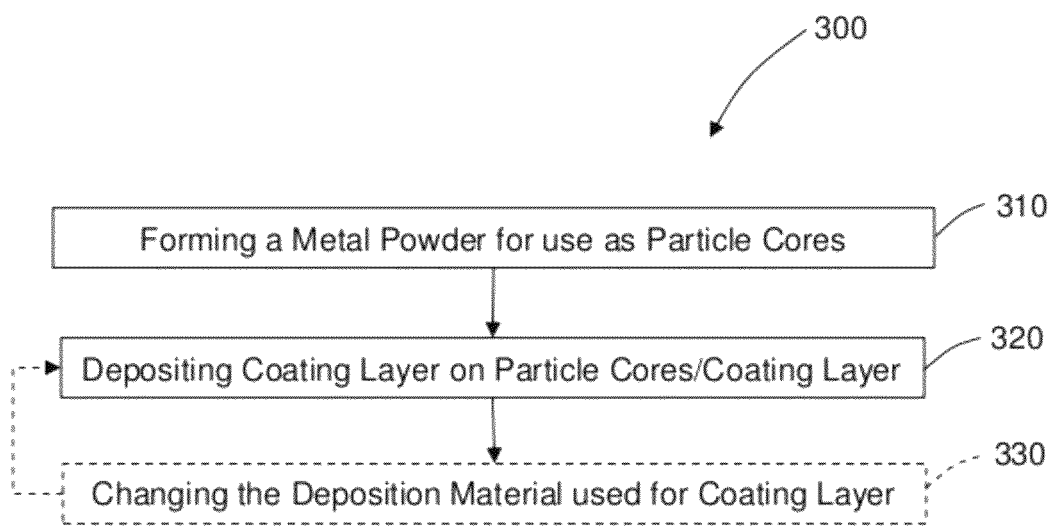
FIG. 8 is a flow chart of an exemplary embodiment of a method of making a powder as disclosed herein.

Referring to FIG. 8, an exemplary embodiment of a method 300 of making a metallic powder 10 is disclosed. Method 300 includes forming 310 a plurality of particle cores 14, including distributed carbon nanoparticles 90, as described herein. Method 300 also includes depositing 320 a metallic coating layer 16 on each of the plurality of particle cores 14. Depositing 320 is the process by which coating layer 16 is disposed on particle core 14 as described herein.

Forming 310 of particle cores 14 may be performed by any suitable method for forming a plurality of particle cores 14 of the desired core material 18, which essentially comprise methods of forming a powder of core material 18. Suitable powder forming methods include mechanical methods; including machining, milling, impacting and other mechanical methods for forming the metal powder; chemical methods, including chemical decomposition, precipitation from a liquid or gas, solid-solid reactive synthesis and other chemical powder forming methods; atomization methods, including gas atomization, liquid and water atomization, centrifugal atomization, plasma atomization and other atomization methods for forming a powder; and various evaporation and condensation methods. Distributed carbon nanoparticles 90 may be dispersed within particle cores 14 and core material 18 by any suitable distribution or dispersion method that is compatible with the method of forming the particle cores 14. In an exemplary embodiment, particle cores 14 comprising Mg may be fabricated using an atomization method, such as vacuum spray forming or inert gas spray forming. Distributed carbon nanoparticles 90 may be distributed within a melt of core material 18 prior to its atomization to form particle cores 14, such as by using various mixing methods to add carbon nanoparticles 90 to the melt. In an exemplary embodiment, carbon nanoparticles 90 may include a metal layer 91 disposed thereon. The composition of metal layer 91 may be selected to include the same composition as core material 18 to improve intermixing of the carbon nanoparticles 90 into the melt, or may be selected to have a composition that is different from core material 18, and may be selected to alloy and intermix with core material 18, or to avoid intermixing and alloying with core material 18, for example. Metal layer 91 may be disposed on carbon nanoparticle 90 by any suitable method, including various chemical or physical deposition methods, and more particularly including plating, chemical vapor deposition or physical vapor deposition methods, and even more particularly by various FBCVD methods.

Depositing 320 of metallic coating layers 16 on the plurality of particle cores 14 may be performed using any suitable deposition method, including various thin film deposition methods, such as, for example, chemical vapor deposition and physical vapor deposition methods. In an exemplary embodiment, depositing 320 of metallic coating layers 16 is performed using fluidized bed chemical vapor deposition (FBCVD). Depositing 320 of the metallic coating layers 16 by FBCVD includes flowing a reactive fluid as a coating medium that includes the desired metallic coating material 20 through a bed of particle cores 14 fluidized in a reactor vessel under suitable conditions, including temperature, pressure and flow rate conditions and the like, sufficient to induce a chemical reaction of the coating medium to produce the desired metallic coating material 20 and induce its deposition upon the surface of particle cores 14 to form coated powder particles 12. The reactive fluid selected will depend upon the metallic coating material 20 desired, and will typically comprise an organometallic compound that includes the metallic material to be deposited, such as nickel tetracarbonyl (Ni$(CO)_4$), tungsten hexafluoride ($WF_6$), and triethyl aluminum ($C_6H_{15}Al$), that is transported in a carrier fluid, such as helium or argon gas. The reactive fluid, including carrier fluid, causes at least a portion of the plurality of particle cores 14 to be suspended in the fluid, thereby enabling the entire surface of the suspended particle cores 14 to be exposed to the reactive fluid, including, for example, a desired organometallic constituent, and enabling deposition of metallic coating material 20 and coating layer 16 over the entire surfaces of particle cores 14 such that they each become enclosed forming coated particles 12 having metallic coating layers 16, as described herein. As also described herein, each metallic coating layer 16 may include a plurality of coating layers. Coating material 20 may be deposited in multiple layers to form a multilayer metallic coating layer 16 by repeating the step of depositing 320 described above and changing 330 the reactive fluid to provide the desired metallic coating material 20 for each subsequent layer, where each subsequent layer is deposited on the outer surface of particle cores 14 that already include any previously deposited coating layer or layers that make up metallic coating layer 16. The metallic coating materials 20 of the respective layers (e.g., 22, 24, 26, 28, etc.) may be different from one another, and the differences may be provided by utilization of different reactive media that are configured to produce the desired metallic coating layers 16 on the particle cores 14 in the fluidize bed reactor.

Figure 9:
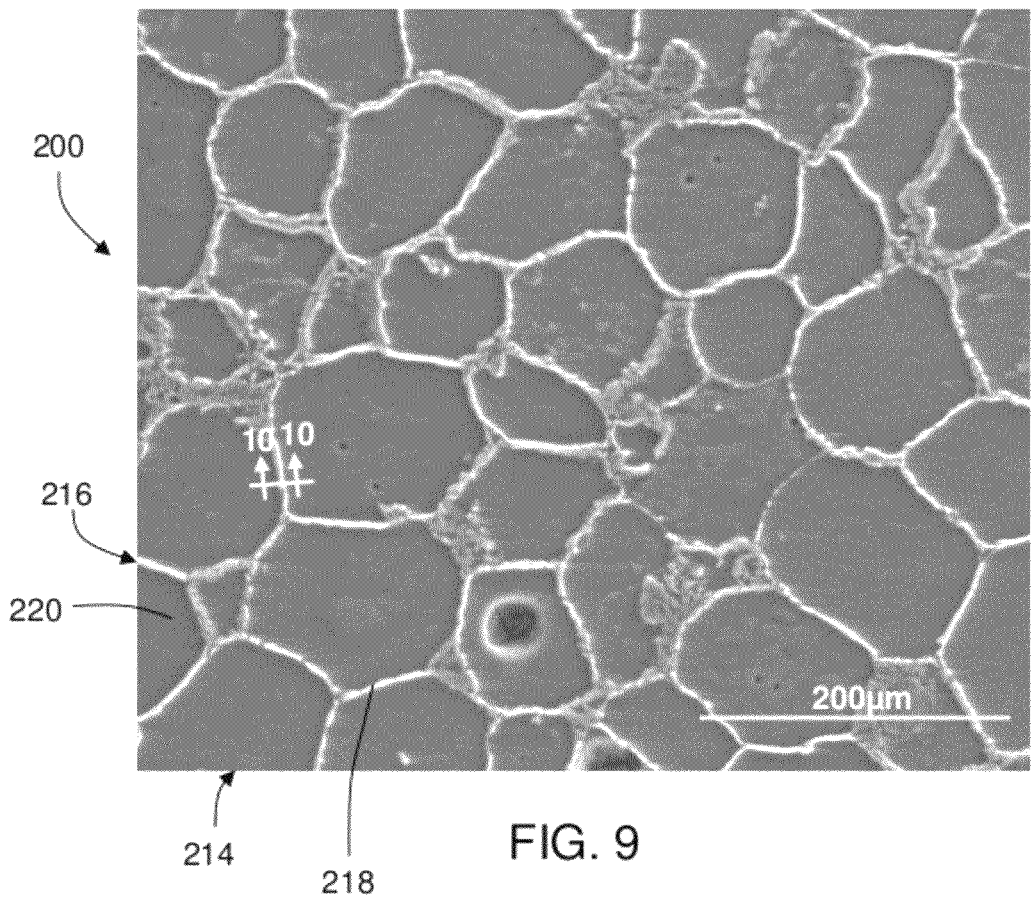
FIG. 9 is a photomicrograph of an exemplary embodiment of a powder compact as disclosed herein.

As illustrated in FIGS. 1 and 9, particle core 14 and core material 18, including distributed carbon nanoparticles 90, and metallic coating layer 16 and coating material 20 may be selected to provide powder particles 12 and a powder 10 that is configured for compaction and sintering to provide a powder compact 200 that is lightweight (i.e., having a relatively low density), high-strength and is selectably and controllably removable from a wellbore in response to a change in a wellbore property, including being selectably and controllably dissolvable in an appropriate wellbore fluid, including various wellbore fluids as disclosed herein. Powder compact 200 includes a substantially-continuous, cellular nanomatrix 216 of a nanomatrix material 220 having a plurality of dispersed particles 214 dispersed throughout the cellular nanomatrix 216. The substantially-continuous cellular nanomatrix 216 and nanomatrix material 220 formed of sintered metallic coating layers 16 is formed by the compaction and sintering of the plurality of metallic coating layers 16 of the plurality of powder particles 12. The chemical composition of nanomatrix material 220 may be different than that of coating material 20 due to diffusion effects associated with the sintering as described herein. Powder metal composite 200 also includes a plurality of dispersed particles 214 that comprise particle core material 218. Dispersed particle cores 214 and core material 218 correspond to and are formed from the plurality of particle cores 14 and core material 18 of the plurality of powder particles 12 as the metallic coating layers 16 are sintered together to form nanomatrix 216. The chemical composition of core material 218 may be different than that of core material 18 due to diffusion effects associated with sintering as described herein. Distributed carbon nanoparticles 290 are distributed within the dispersed particles 214 as described herein, and may be included in all of the dispersed particles 214, or only a portion of them, as described herein. Distributed carbon nanoparticles 290 formed from carbon nanoparticles 90 having a metal layer 91 disposed thereon may retain all or a portion of that layer in the compact as distributed carbon nanoparticles 291.

As used herein, the use of the term substantially-continuous cellular nanomatrix 216 does not connote the major constituent of the powder compact, but rather refers to the minority constituent or constituents, whether by weight or by volume. This is distinguished from most matrix composite materials where the matrix comprises the majority constituent by weight or volume. The use of the term substantially-continuous, cellular nanomatrix is intended to describe the extensive, regular, continuous and interconnected nature of the distribution of nanomatrix material 220 within powder compact 200. As used herein, "substantially-continuous" describes the extension of the nanomatrix material throughout powder compact 200 such that it extends between and envelopes substantially all of the dispersed particles 214. Substantially-continuous is used to indicate that complete continuity and regular order of the nanomatrix around each dispersed particle 214 is not required. For example, defects in the coating layer 16 over particle core 14 on some powder particles 12 may cause bridging of the particle cores 14 during sintering of the powder compact 200, thereby causing localized discontinuities to result within the cellular nanomatrix 216, even though in the other portions of the powder compact the nanomatrix is substantially continuous and exhibits the structure described herein. As used herein, "cellular" is used to indicate that the nanomatrix defines a network of generally repeating, interconnected, compartments or cells of nanomatrix material 220 that encompass and also interconnect the dispersed particles 214. As used herein, "nanomatrix" is used to describe the size or scale of the matrix, particularly the thickness of the matrix between adjacent dispersed particles 214. The metallic coating layers that are sintered together to form the nanomatrix are themselves nanoscale thickness coating layers. Since the nanomatrix at most locations, other than the intersection of more than two dispersed particles 214, generally comprises the interdiffusion and bonding of two coating layers 16 from adjacent powder particles 12 having nanoscale thicknesses, the matrix formed also has a nanoscale thickness (e.g., approximately two times the coating layer thickness as described herein) and is thus described as a nanomatrix. Further, the use of the term dispersed particles 214 does not connote the minor constituent of powder compact 200, but rather refers to the majority constituent or constituents, whether by weight or by volume. The use of the term dispersed particle is intended to convey the discontinuous and discrete distribution of particle core material 218 within powder compact 200.

Powder compact 200 may have any desired shape or size, including that of a cylindrical billet or bar that may be machined or otherwise used to form useful articles of manufacture, including various wellbore tools and components. The pressing used to form precursor powder compact 100 and sintering and pressing processes used to form powder compact 200 and deform the powder particles 12, including particle cores 14 and coating layers 16, to provide the full density and desired macroscopic shape and size of powder compact 200 as well as its microstructure. The microstructure of powder compact 200 includes an equiaxed configuration of dispersed particles 214, including distributed carbon nanoparticles 290, that are dispersed throughout and embedded within the substantially-continuous, cellular nanomatrix 216 of sintered coating layers. This microstructure is somewhat analogous to an equiaxed grain microstructure with a continuous grain boundary phase, except that it does not require the use of alloy constituents having thermodynamic phase equilibria properties that are capable of producing such a structure. Rather, this equiaxed dispersed particle structure and cellular nanomatrix 216 of sintered metallic coating layers 16 may be produced using constituents where thermodynamic phase equilibrium conditions would not produce an equiaxed structure. The equiaxed morphology of the dispersed particles 214 and cellular network 216 of particle layers results from sintering and deformation of the powder particles 12 as they are compacted and interdiffuse and deform to fill the interparticle spaces 15 (FIG. 1). The sintering temperatures and pressures may be selected to ensure that the density of powder compact 200 achieves substantially full theoretical density.

Figure 10:
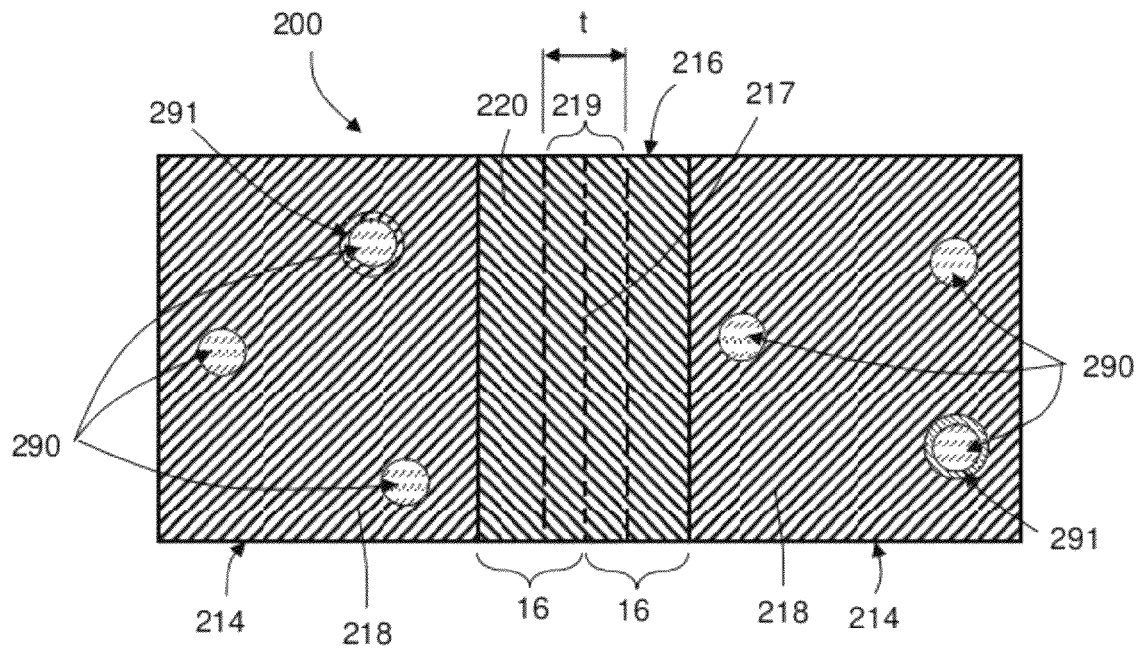
FIG. 10 is a schematic of illustration of an exemplary embodiment of the powder compact of FIG. 9 made using a powder having single-layer coated powder particles as it would appear taken along section 10-10.

In an exemplary embodiment as illustrated in FIGS. 1 and 9, dispersed particles 214 are formed from particle cores 14 dispersed in the cellular nanomatrix 216 of sintered metallic coating layers 16, and the nanomatrix 216 includes a metallurgical bond 217, such as a solid-state metallurgical bond, or bond layer 219, as illustrated schematically in FIG. 10, extending between the dispersed particles 214 throughout the cellular nanomatrix 216 that is formed at a sintering temperature ($T_S$), where $T_S$ is less than $T_C$ and $T_P$. As indicated, metallurgical bond 217 is formed by controlled interdiffusion between the coating layers 16 of adjacent powder particles 12 that are compressed into touching contact during the compaction and sintering processes used to form powder compact 200, as described herein. In one embodiment, this may include a solid-state metallurgical bond 217 formed in the solid state by solid-state interdiffusion between the coating layers 16 of adjacent powder particles 12 that are compressed into touching contact during the compaction and sintering processes used to form powder compact 200, as described herein. As such, sintered coating layers 16 of cellular nanomatrix 216 include a bond layer 219 that has a thickness (t) defined by the extent of the interdiffusion of the coating materials 20 of the metallic coating layers 16, which will in turn be defined by the nature of the coating layers 16, including whether they are single or multilayer coating layers, whether they have been selected to promote or limit such interdiffusion, and other factors, as described herein, as well as the sintering and compaction conditions, including the sintering time, temperature and pressure used to form powder compact 200.

As nanomatrix 216 is formed, including bond 217 and bond layer 219, the chemical composition or phase distribution, or both, of metallic coating layers 16 may change. Nanomatrix 216 also has a melting temperature ($T_M$). As used herein, $T_M$ includes the lowest temperature at which incipient melting or liquation or other forms of partial melting will occur within nanomatrix 216, regardless of whether nanomatrix material 220 comprises a pure metal, an alloy with multiple phases each having different melting temperatures or a composite, including a composite comprising a plurality of layers of various coating materials having different melting temperatures, or a combination thereof, or otherwise. As dispersed particles 214 and particle core materials 218 are formed in conjunction with nanomatrix 216, diffusion of constituents of metallic coating layers 16 into the particle cores 14 is also possible, which may result in changes in the chemical composition or phase distribution, or both, of particle cores 14. As a result, dispersed particles 214 and particle core materials 218, including distributed carbon nanoparticles 290, may have a melting temperature ($T_{DP}$) that is different than $T_P$. As used herein, $T_{DP}$ includes the lowest temperature at which incipient melting or liquation or other forms of partial melting will occur within dispersed particles 214, regardless of whether particle core material 218 comprise a pure metal, an alloy with multiple phases each having different melting temperatures or a composite, or otherwise. In one exemplary embodiment, powder compact 200 is formed at a sintering temperature ($T_S$), where $T_S$ is less than $T_C$, $T_P$, $T_M$ and $T_{DP}$, and the sintering is performed entirely in the solid-state resulting in a solid-state bond layer. In another exemplary embodiment, powder compact 200 is formed at a sintering temperature ($T_S$), where $T_S$ is greater than or equal to one or more of $T_C$, $T_P$, $T_M$ or $T_{DP}$ and the sintering includes limited or partial melting within the powder compact 200 as described herein, and further may include liquid-state or liquid-phase sintering resulting in a bond layer that is at least partially melted and resolidified. In this embodiment, the combination of a predetermined $T_S$ and a predetermined sintering time ($t_S$) will be selected to preserve the desired microstructure that includes the cellular nanomatrix 216 and dispersed particles 214. For example, localized liquation or melting may be permitted to occur, for example, within all or a portion of nanomatrix 216 so long as the cellular nanomatrix 216/dispersed particle 214 morphology is preserved, such as by selecting particle cores 14, $T_S$ and $t_S$ that do not provide for complete melting of particle cores. Similarly, localized liquation may be permitted to occur, for example, within all or a portion of dispersed particles 214 so long as the cellular nanomatrix 216/dispersed particle 214 morphology is preserved, such as by selecting metallic coating layers 16, $T_S$ and $t_S$ that do not provide for complete melting of the coating layer or layers 16. Melting of metallic coating layers 16 may, for example, occur during sintering along the metallic layer 16/particle core 14 interface, or along the interface between adjacent layers of multi-layer coating layers 16. It will be appreciated that combinations of $T_S$ and $t_S$ that exceed the predetermined values may result in other microstructures, such as an equilibrium melt/resolidification microstructure if, for example, both the nanomatrix 216 (i.e., combination of metallic coating layers 16) and dispersed particles 214 (i.e., the particle cores 14) are melted, thereby allowing rapid interdiffusion of these materials.

Dispersed particles 214 may comprise any of the materials described herein for particle cores 14, even though the chemical composition of dispersed particles 214 may be different due to diffusion effects as described herein. In an exemplary embodiment, dispersed particles 214 are formed from particle cores 14 comprising materials having a standard oxidation potential greater than or equal to Zn, including Mg, Al, Zn or Mn, or a combination thereof, may include various binary, tertiary and quaternary alloys or other combinations of these constituents as disclosed herein in conjunction with particle cores 14. Of these materials, those having dispersed particles 214 comprising Mg and the nanomatrix 216 formed from the metallic coating materials 16 described herein are particularly useful. Dispersed particles 214 and particle core material 218 of Mg, Al, Zn or Mn, or a combination thereof, may also include a rare earth element, or a combination of rare earth elements as disclosed herein in conjunction with particle cores 14.

In another exemplary embodiment, dispersed particles 214 are formed from particle cores 14 comprising metals that are less electrochemically active than Zn or non-metallic materials. Suitable non-metallic materials include ceramics, glasses (e.g., hollow glass microspheres) or carbon, or a combination thereof, as described herein.

Dispersed particles 214 of powder compact 200 may have any suitable particle size, including the average particle sizes described herein for particle cores 14.

Dispersed particles 214 may have any suitable shape depending on the shape selected for particle cores 14 and powder particles 12, as well as the method used to sinter and compact powder 10. In an exemplary embodiment, powder particles 12 may be spheroidal or substantially spheroidal and dispersed particles 214 may include an equiaxed particle configuration as described herein.

The nature of the dispersion of dispersed particles 214 may be affected by the selection of the powder 10 or powders 10 used to make particle compact 200. In one exemplary embodiment, a powder 10 having a unimodal distribution of powder particle 12 sizes may be selected to form powder compact 200 and will produce a substantially homogeneous unimodal dispersion of particle sizes of dispersed particles 214 within cellular nanomatrix 216, as illustrated generally in FIG. 9. In another exemplary embodiment, a plurality of powders 10 having a plurality of powder particles with particle cores 14 that have the same core materials 18 and different core sizes and the same coating material 20 may be selected and uniformly mixed as described herein to provide a powder 10 having a homogenous, multimodal distribution of powder particle 12 sizes, and may be used to form powder compact 200 having a homogeneous, multimodal dispersion of particle sizes of dispersed particles 214 within cellular nanomatrix 216, as illustrated schematically in FIGS. 6 and 11. Similarly, in yet another exemplary embodiment, a plurality of powders 10 having a plurality of particle cores 14 that may have the same core materials 18 and different core sizes and the same coating material 20 may be selected and distributed in a non-uniform manner to provide a non-homogenous, multimodal distribution of powder particle sizes, and may be used to form powder compact 200 having a non-homogeneous, multimodal dispersion of particle sizes of dispersed particles 214 within cellular nanomatrix 216, as illustrated schematically in FIG. 12. The selection of the distribution of particle core size may be used to determine, for example, the particle size and interparticle spacing of the dispersed particles 214 within the cellular nanomatrix 216 of powder compacts 200 made from powder 10.

Figure 13:
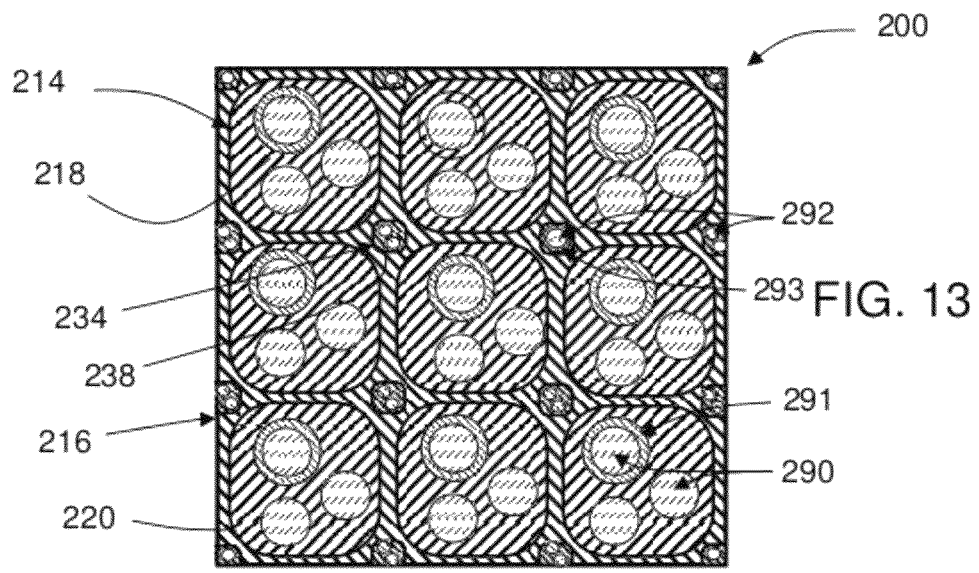
FIG. 13 is a schematic illustration of an exemplary embodiment of a powder compact as disclosed herein formed from a first powder and a second powder and having a homogenous multi-modal distribution of particle sizes.
Figure 14:
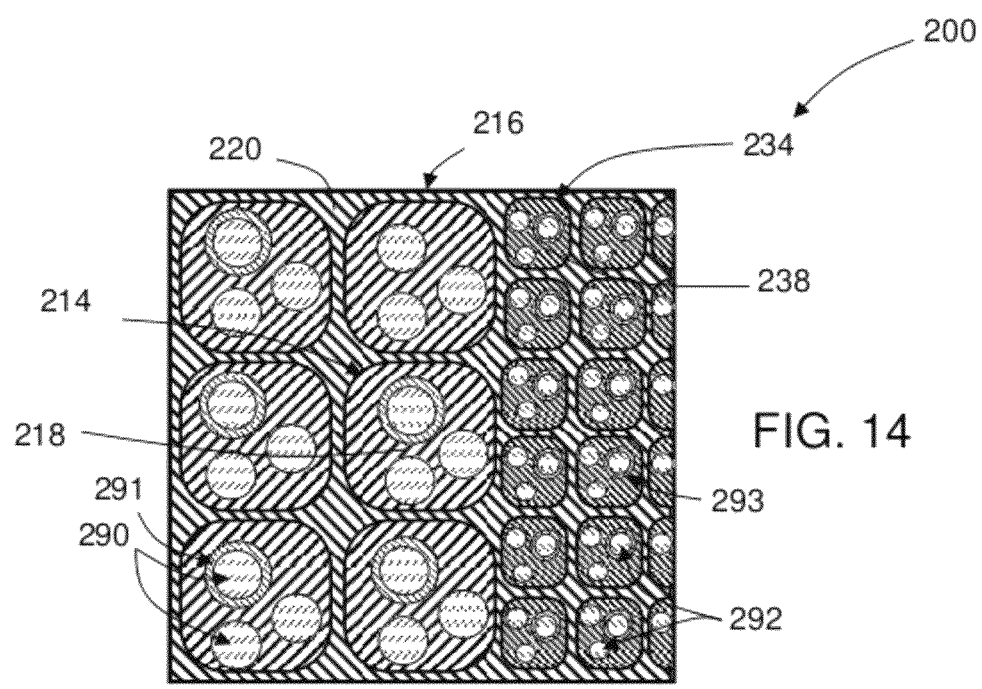
FIG. 14 is a schematic illustration of an exemplary embodiment of a powder compact as disclosed herein formed from a first powder and a second powder and having a non-homogeneous multi-modal distribution of particle sizes.

As illustrated generally in FIGS. 7 and 13, powder metal composite 200 may also be formed using coated metallic powder 10 and an additional or second powder 30, as described herein. The use of an additional powder 30 provides a powder compact 200 that also includes a plurality of dispersed second particles 234, as described herein, that are dispersed within the nanomatrix 216 and are also dispersed with respect to the dispersed particles 214. Dispersed second particles 234 may be formed from coated or uncoated second powder particles 32, as described herein, and may also include second distributed carbon nanoparticles 92, as described herein. In an exemplary embodiment, coated second powder particles 32 may be coated with a coating layer 36 that is the same as coating layer 16 of powder particles 12, such that coating layers 36 also contribute to the nanomatrix 216. In another exemplary embodiment, the second powder particles 232 may be uncoated such that dispersed second particles 234 are embedded within nanomatrix 216. Second distributed carbon nanoparticles 292 may be distributed within the dispersed second particles 234 as described herein, and may be included in all of the dispersed second particles 234, or only a portion of them, as described herein. Distributed second carbon nanoparticles 292 formed from second carbon nanoparticles 92 having a metal layer 93 disposed thereon may retain all or a portion of that layer in the compact as distributed second carbon nanoparticles 293. As disclosed herein, powder 10 and additional powder 30 may be mixed to form a homogeneous dispersion of dispersed particles 214 and dispersed second particles 234, as illustrated in FIG. 13, or to form a non-homogeneous dispersion of these particles, as illustrated in FIG. 14. The dispersed second particles 234 may be formed from any suitable additional powder 30 that is different from powder 10, either due to a compositional difference in the particle core 34, or coating layer 36, or both of them, and may include any of the materials disclosed herein for use as second powder 30 that are different from the powder 10 that is selected to form powder compact 200. In an exemplary embodiment, dispersed second particles 234 may include Fe, Ni, Co or Cu, or oxides, nitrides or carbides thereof, or a combination of any of the aforementioned materials.

Nanomatrix 216 is a substantially-continuous, cellular network of metallic coating layers 16 that are sintered to one another. The thickness of nanomatrix 216 will depend on the nature of the powder 10 or powders 10 used to form powder compact 200, as well as the incorporation of any second powder 30, particularly the thicknesses of the coating layers associated with these particles. In an exemplary embodiment, the thickness of nanomatrix 216 is substantially uniform throughout the microstructure of powder compact 200 and comprises about two times the thickness of the coating layers 16 of powder particles 12. In another exemplary embodiment, the cellular network 216 has a substantially uniform average thickness between dispersed particles 214 of about 50 nm to about 5000 nm.

Nanomatrix 216 is formed by sintering metallic coating layers 16 of adjacent particles to one another by interdiffusion and creation of bond layer 219 as described herein. Metallic coating layers 16 may be single layer or multilayer structures, and they may be selected to promote or inhibit diffusion, or both, within the layer or between the layers of metallic coating layer 16, or between the metallic coating layer 16 and particle core 14, or between the metallic coating layer 16 and the metallic coating layer 16 of an adjacent powder particle, the extent of interdiffusion of metallic coating layers 16 during sintering may be limited or extensive depending on the coating thicknesses, coating material or materials selected, the sintering conditions and other factors. Given the potential complexity of the interdiffusion and interaction of the constituents, description of the resulting chemical composition of nanomatrix 216 and nanomatrix material 220 may be simply understood to be a combination of the constituents of coating layers 16 that may also include one or more constituents of dispersed particles 214, depending on the extent of interdiffusion, if any, that occurs between the dispersed particles 214 and the nanomatrix 216. Similarly, the chemical composition of dispersed particles 214 and particle core material 218 may be simply understood to be a combination of the constituents of particle core 14 that may also include one or more constituents of nanomatrix 216 and nanomatrix material 220, depending on the extent of interdiffusion, if any, that occurs between the dispersed particles 214 and the nanomatrix 216.

In an exemplary embodiment, the nanomatrix material 220 has a chemical composition and the particle core material 218 has a chemical composition that is different from that of nanomatrix material 220, and the differences in the chemical compositions may be configured to provide a selectable and controllable dissolution rate, including a selectable transition from a very low dissolution rate to a very rapid dissolution rate, in response to a controlled change in a property or condition of the wellbore proximate the compact 200, including a property change in a wellbore fluid that is in contact with the powder compact 200, as described herein. Nanomatrix 216 may be formed from powder particles 12 having single layer and multilayer coating layers 16. This design flexibility provides a large number of material combinations, particularly in the case of multilayer coating layers 16, that can be utilized to tailor the cellular nanomatrix 216 and composition of nanomatrix material 220 by controlling the interaction of the coating layer constituents, both within a given layer, as well as between a coating layer 16 and the particle core 14 with which it is associated or a coating layer 16 of an adjacent powder particle 12. Several exemplary embodiments that demonstrate this flexibility are provided below.

As illustrated in FIG. 10, in an exemplary embodiment, powder compact 200 is formed from powder particles 12 where the coating layer 16 comprises a single layer, and the resulting nanomatrix 216 between adjacent ones of the plurality of dispersed particles 214 comprises the single metallic coating layer 16 of one powder particle 12, a bond layer 219 and the single coating layer 16 of another one of the adjacent powder particles 12. The thickness (t) of bond layer 219 is determined by the extent of the interdiffusion between the single metallic coating layers 16, and may encompass the entire thickness of nanomatrix 216 or only a portion thereof. In one exemplary embodiment of powder compact 200 formed using a single layer powder 10, powder compact 200 may include dispersed particles 214 comprising Mg, Al, Zn or Mn, or a combination thereof, as described herein, and nanomatrix 216 may include Al, Zn, Mn, Mg, Mo, W, Cu, Fe, Si, Ca, Co, Ta, Re or Ni, or an oxide, carbide or nitride thereof, or a combination of any of the aforementioned materials, including combinations where the nanomatrix material 220 of cellular nanomatrix 216, including bond layer 219, has a chemical composition and the core material 218 of dispersed particles 214 has a chemical composition that is different than the chemical composition of nanomatrix material 216. The difference in the chemical composition of the nanomatrix material 220 and the core material 218 may be used to provide selectable and controllable dissolution in response to a change in a property of a wellbore, including a wellbore fluid, as described herein. In a further exemplary embodiment of a powder compact 200 formed from a powder 10 having a single coating layer configuration, dispersed particles 214 include Mg, Al, Zn or Mn, or a combination thereof, and the cellular nanomatrix 216 includes Al or Ni, or a combination thereof.

Figure 15:
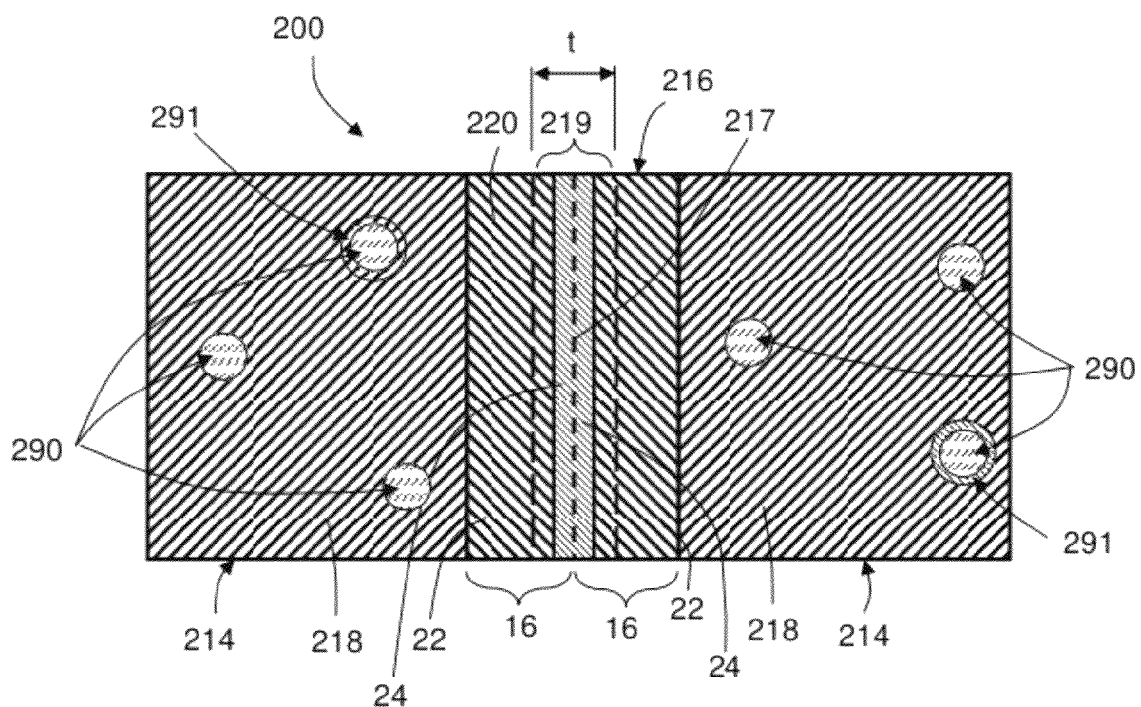
FIG. 15 is a schematic of illustration of another exemplary embodiment of the powder compact of FIG. 9 made using a powder having multilayer coated powder particles as it would appear taken along section 10-10.
Figure 11:
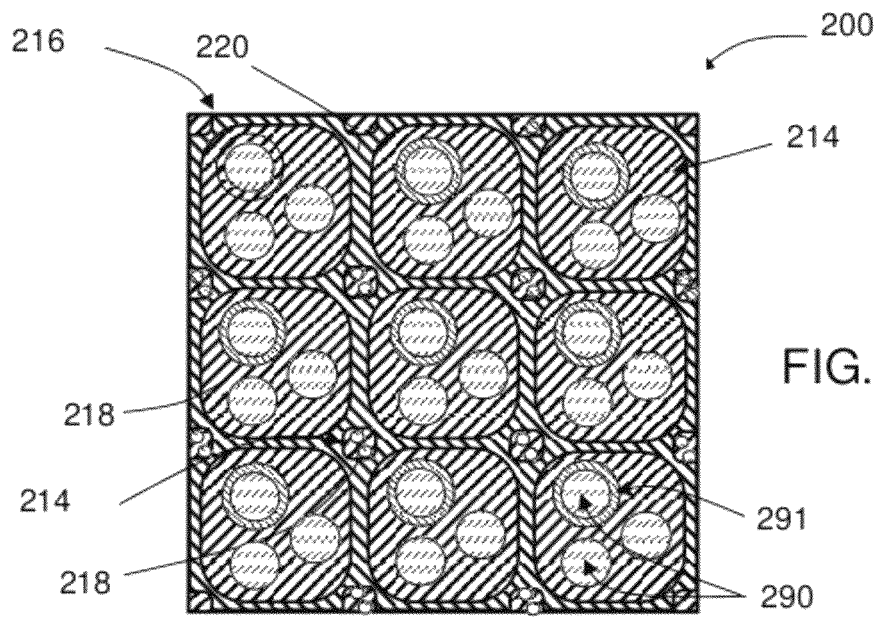
FIG. 11 is a schematic illustration of an exemplary embodiment of a powder compact as disclosed herein having a homogenous multi-modal distribution of particle sizes.
Figure 12:
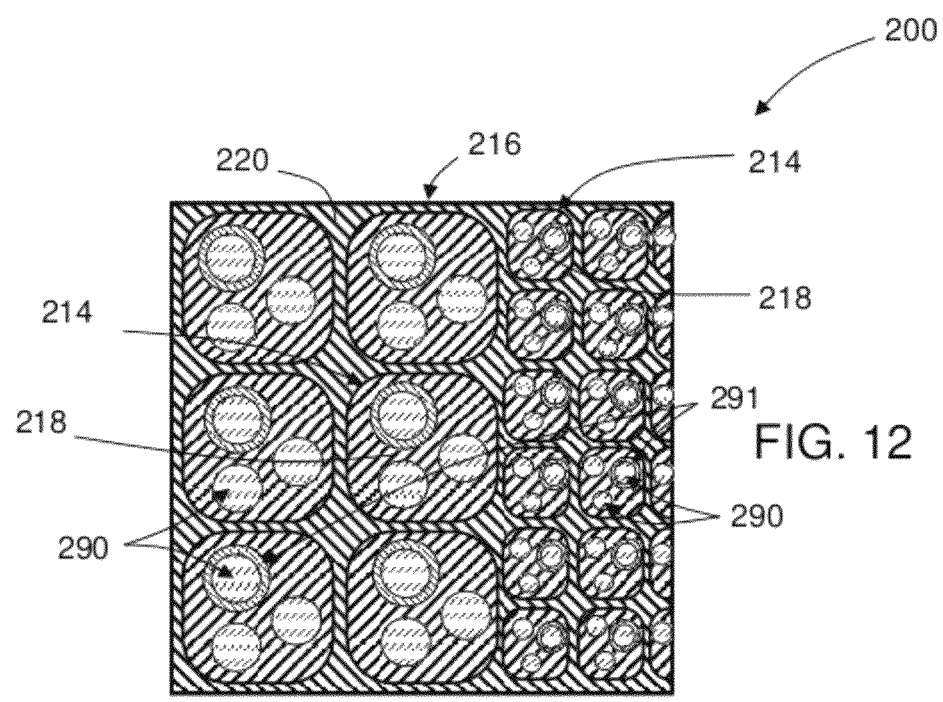
FIG. 12 is a schematic illustration of an exemplary embodiment of a powder compact as disclosed herein having a non-homogeneous, multi-modal distribution of particle sizes.

As illustrated in FIG. 15, in another exemplary embodiment, powder compact 200 is formed from powder particles 12 where the coating layer 16 comprises a multilayer coating layer 16 having a plurality of coating layers, and the resulting nanomatrix 216 between adjacent ones of the plurality of dispersed particles 214 comprises the plurality of layers (t) comprising the coating layer 16 of one particle 12, a bond layer 219, and the plurality of layers comprising the coating layer 16 of another one of powder particles 12. In FIG. 15, this is illustrated with a two-layer metallic coating layer 16, but it will be understood that the plurality of layers of multi-layer metallic coating layer 16 may include any desired number of layers. The thickness (t) of the bond layer 219 is again determined by the extent of the interdiffusion between the plurality of layers of the respective coating layers 16, and may encompass the entire thickness of nanomatrix 216 or only a portion thereof. In this embodiment, the plurality of layers comprising each coating layer 16 may be used to control interdiffusion and formation of bond layer 219 and thickness (t).

In one exemplary embodiment of a powder compact 200 made using powder particles 12 with multilayer coating layers 16, the compact includes dispersed particles 214 comprising Mg, Al, Zn or Mn, or a combination thereof, as described herein, and nanomatrix 216 comprises a cellular network of sintered two-layer coating layers 16, as shown in FIG. 3, comprising first layers 22 that are disposed on the dispersed particles 214 and a second layers 24 that are disposed on the first layers 22. First layers 22 include Al or Ni, or a combination thereof, and second layers 24 include Al, Zn, Mn, Mg, Mo, W, Cu, Fe, Si, Ca, Co, Ta, Re or Ni, or a combination thereof. In these configurations, materials of dispersed particles 214 and multilayer coating layer 16 used to form nanomatrix 216 are selected so that the chemical compositions of adjacent materials are different (e.g. dispersed particle/first layer and first layer/second layer).

In another exemplary embodiment of a powder compact 200 made using powder particles 12 with multilayer coating layers 16, the compact includes dispersed particles 214 comprising Mg, Al, Zn or Mn, or a combination thereof, as described herein, and nanomatrix 216 comprises a cellular network of sintered three-layer metallic coating layers 16, as shown in FIG. 4, comprising first layers 22 that are disposed on the dispersed particles 214, second layers 24 that are disposed on the first layers 22 and third layers 26 that are disposed on the second layers 24. First layers 22 include Al or Ni, or a combination thereof; second layers 24 include Al, Zn, Mn, Mg, Mo, W, Cu, Fe, Si, Ca, Co, Ta, Re or Ni, or an oxide, nitride or carbide thereof, or a combination of any of the aforementioned second layer materials; and the third layers include Al, Zn, Mn, Mg, Mo, W, Cu, Fe, Si, Ca, Co, Ta, Re or Ni, or a combination thereof. The selection of materials is analogous to the selection considerations described herein for powder compact 200 made using two-layer coating layer powders, but must also be extended to include the material used for the third coating layer.

In yet another exemplary embodiment of a powder compact 200 made using powder particles 12 with multilayer coating layers 16, the compact includes dispersed particles 214 comprising Mg, Al, Zn or Mn, or a combination thereof, as described herein, and nanomatrix 216 comprise a cellular network of sintered four-layer coating layers 16 comprising first layers 22 that are disposed on the dispersed particles 214; second layers 24 that are disposed on the first layers 22; third layers 26 that are disposed on the second layers 24 and fourth layers 28 that are disposed on the third layers 26. First layers 22 include Al or Ni, or a combination thereof; second layers 24 include Al, Zn, Mn, Mg, Mo, W, Cu, Fe, Si, Ca, Co, Ta, Re or Ni, or an oxide, nitride or carbide thereof, or a combination of any of the aforementioned second layer materials; third layers include Al, Zn, Mn, Mg, Mo, W, Cu, Fe, Si, Ca, Co, Ta, Re or Ni, or an oxide, nitride or carbide thereof, or a combination of any of the aforementioned third layer materials; and fourth layers include Al, Mn, Fe, Co or Ni, or a combination thereof. The selection of materials is analogous to the selection considerations described herein for powder compacts 200 made using two-layer coating layer powders, but must also be extended to include the material used for the third and fourth coating layers.

In another exemplary embodiment of a powder compact 200, dispersed particles 214 comprise a metal having a standard oxidation potential less than Zn or a non-metallic material, or a combination thereof, as described herein, and nanomatrix 216 comprises a cellular network of sintered metallic coating layers 16. Suitable non-metallic materials include various ceramics, glasses or forms of carbon, or a combination thereof. Further, in powder compacts 200 that include dispersed particles 214 comprising these metals or non-metallic materials, nanomatrix 216 may include Al, Zn, Mn, Mg, Mo, W, Cu, Fe, Si, Ca, Co, Ta, Re or Ni, or an oxide, carbide or nitride thereof, or a combination of any of the aforementioned materials as nanomatrix material 220.

Figure 16:
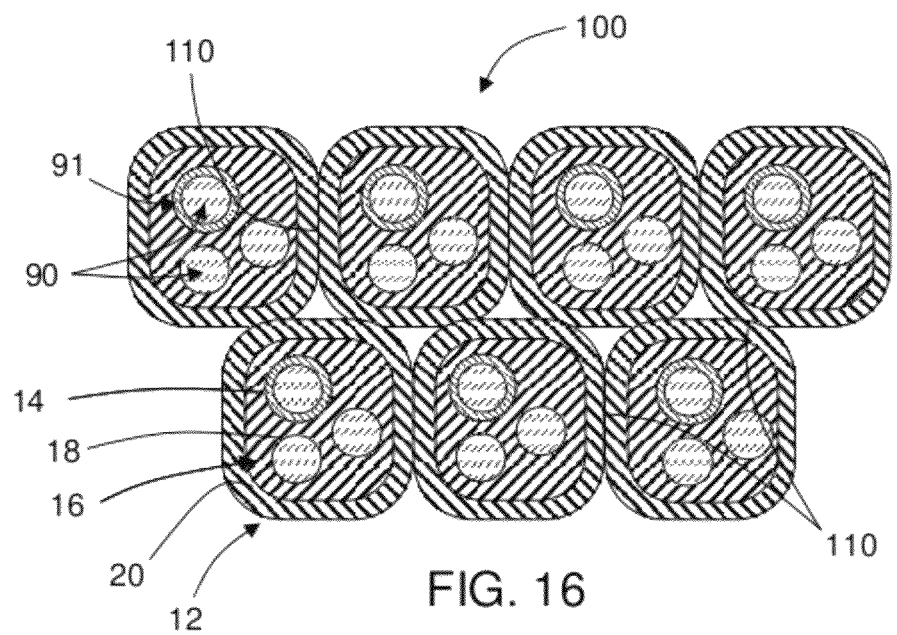
FIG. 16 is a schematic cross-sectional illustration of an exemplary embodiment of a precursor powder compact.

Referring to FIG. 16, sintered powder compact 200 may comprise a sintered precursor powder compact 100 that includes a plurality of deformed, mechanically bonded powder particles as described herein. Precursor powder compact 100 may be formed by compaction of powder 10 to the point that powder particles 12 are pressed into one another, thereby deforming them and forming interparticle mechanical or other bonds 110 associated with this deformation sufficient to cause the deformed powder particles 12 to adhere to one another and form a green-state powder compact having a green density that is less than the theoretical density of a fully-dense compact of powder 10, due in part to interparticle spaces 15. Compaction may be performed, for example, by isostatically pressing powder 10 at room temperature to provide the deformation and interparticle bonding of powder particles 12 necessary to form precursor powder compact 100.

Sintered and forged powder compacts 200 that include dispersed particles 214 comprising Mg and nanomatrix 216 comprising various nanomatrix materials as described herein have demonstrated an excellent combination of mechanical strength and low density that exemplify the lightweight, high-strength materials disclosed herein. These materials may be configured to provide a wide range of selectable and controllable corrosion or dissolution behavior from very low corrosion rates to extremely high corrosion rates, particularly corrosion rates that are both lower and higher than those of powder compacts that do not incorporate the cellular nanomatrix, such as a compact formed from pure Mg powder through the same compaction and sintering processes in comparison to those that include pure Mg dispersed particles in the various cellular nanomatrices described herein. These powder compacts 200 may also be configured to provide substantially enhanced properties as compared to powder compacts formed from pure Mg particles that do not include the nanoscale coatings described herein. For example, powder compacts 200 that include dispersed particles 214 comprising Mg and nanomatrix 216 comprising various nanomatrix materials 220 described herein have demonstrated room temperature compressive strengths of at least about 37 ksi, and have further demonstrated room temperature compressive strengths in excess of about 50 ksi, both dry and immersed in a solution of 3% KCl at 200° F. The incorporation of distributed carbon nanoparticles, such as distributed carbon nanoparticles 90, is expected to further increase the compressive strength values of these powder compacts 200. In contrast, powder compacts formed from pure Mg powders have a compressive strength of about 20 ksi or less. Strength of the nanomatrix powder metal composite 200 can be further improved by optimizing powder 10, particularly the weight percentage of the nanoscale metallic coating layers 16 that are used to form cellular nanomatrix 216. For example, varying the weight percentage (wt. %), i.e., thickness, of an alumina coating varies the room temperature compressive strength of a powder compact 200 of a cellular nanomatrix 216 formed from coated powder particles 12 that include a multilayer (Al/Al$_2$O$_3$/Al) metallic coating layer 16 on pure Mg particle cores 14. In this example, optimal strength is achieved at 4 wt % of alumina, which represents an increase of 21% as compared to that of 0 wt % alumina.

Powder compacts 200 comprising dispersed particles 214 that include Mg and nanomatrix 216 that includes various nanomatrix materials as described herein have also demonstrated a room temperature sheer strength of at least about 20 ksi. This is in contrast with powder compacts formed from pure Mg powders which have room temperature sheer strengths of about 8 ksi. The incorporation of distributed carbon nanoparticles 90 is expected to further increase the room temperature sheer strength values of these powder compacts 200.

Powder compacts 200 of the types disclosed herein are able to achieve an actual density that is substantially equal to the predetermined theoretical density of a compact material based on the composition of powder 10, including relative amounts of constituents of particle cores 14 and metallic coating layer 16, and are also described herein as being fully-dense powder compacts. Powder compacts 200 comprising dispersed particles that include Mg and nanomatrix 216 that includes various nanomatrix materials as described herein have demonstrated actual densities of about 1.738 g/cm$^3$ to about 2.50 g/cm$^3$, which are substantially equal to the predetermined theoretical densities, differing by at most 4% from the predetermined theoretical densities. The incorporation of distributed carbon nanoparticles 92, including those having a lower density, including a density of about 1.3 to about 1.4 g/cm$^3$, will reduce these densities by an amount that depends on the relative amounts of distributed carbon nanoparticles 92 used.

Powder compacts 200 as disclosed herein may be configured to be selectively and controllably dissolvable in a wellbore fluid in response to a changed condition in a wellbore. Examples of the changed condition that may be exploited to provide selectable and controllable dissolvability include a change in temperature, change in pressure, change in flow rate, change in pH or change in chemical composition of the wellbore fluid, or a combination thereof. An example of a changed condition comprising a change in temperature includes a change in well bore fluid temperature. Powder compacts 200 comprising dispersed particles 214 that include Mg and cellular nanomatrix 216 that includes various nanomatrix materials as described herein have relatively low rates of corrosion in a 3% KCl solution at room temperature that ranges from about 0 to about 11 mg/cm$^2$/hr as compared to relatively high rates of corrosion at 200° F. that range from about 1 to about 246 mg/cm$^2$/hr depending on different nanoscale coating layers 16. An example of a changed condition comprising a change in chemical composition includes a change in a chloride ion concentration or pH value, or both, of the wellbore fluid. For example, powder compacts 200 comprising dispersed particles 214 that include Mg and nanomatrix 216 that includes various nanoscale coatings described herein demonstrate corrosion rates in 15% HCl that range from about 4750 mg/cm$^2$/hr to about 7432 mg/cm$^2$/hr. Thus, selectable and controllable dissolvability in response to a changed condition in the wellbore, namely the change in the wellbore fluid chemical composition from KCl to HCl, may be used to achieve a characteristic response such that at a selected predetermined critical service time (CST) a changed condition may be imposed upon powder compact 200 as it is applied in a given application, such as a wellbore environment, that causes a controllable change in a property of powder compact 200 in response to a changed condition in the environment in which it is applied. For example, at a predetermined CST changing a wellbore fluid that is in contact with powder contact 200 from a first fluid (e.g. KCl) that provides a first corrosion rate and an associated weight loss or strength as a function of time to a second wellbore fluid (e.g., HCl) that provides a second corrosion rate and associated weight loss and strength as a function of time, wherein the corrosion rate associated with the first fluid is much less than the corrosion rate associated with the second fluid. This characteristic response to a change in wellbore fluid conditions may be used, for example, to associate the critical service time with a dimension loss limit or a minimum strength needed for a particular application, such that when a wellbore tool or component formed from powder compact 200 as disclosed herein is no longer needed in service in the wellbore (e.g., the CST) the condition in the wellbore (e.g., the chloride ion concentration of the wellbore fluid) may be changed to cause the rapid dissolution of powder compact 200 and its removal from the wellbore. In the example described above, powder compact 200 is selectably dissolvable at a rate that ranges from about 0 to about 7000 mg/cm$^2$/hr. This range of response provides, for example the ability to remove a 3 inch diameter ball formed from this material from a wellbore by altering the wellbore fluid in less than one hour. The selectable and controllable dissolvability behavior described above, coupled with the excellent strength and low density properties described herein, define a new engineered dispersed particle-nanomatrix material that is configured for contact with a fluid and configured to provide a selectable and controllable transition from one of a first strength condition to a second strength condition that is lower than a functional strength threshold, or a first weight loss amount to a second weight loss amount that is greater than a weight loss limit, as a function of time in contact with the fluid. The dispersed particle-nanomatrix composite is characteristic of the powder compacts 200 described herein and includes a cellular nanomatrix 216 of nanomatrix material 220, a plurality of dispersed particles 214 including particle core material 218 that is dispersed within the matrix. Nanomatrix 216 is characterized by a bond layer 219, such as a solid-state bond layer, which extends throughout the nanomatrix. The time in contact with the fluid described above may include the CST as described above. The CST may include a predetermined time that is desired or required to dissolve a predetermined portion of the powder compact 200 that is in contact with the fluid. The CST may also include a time corresponding to a change in the property of the engineered material or the fluid, or a combination thereof. In the case of a change of property of the engineered material, the change may include a change of a temperature of the engineered material. In the case where there is a change in the property of the fluid, the change may include the change in a fluid temperature, pressure, flow rate, chemical composition or pH or a combination thereof. Both the engineered material and the change in the property of the engineered material or the fluid, or a combination thereof, may be tailored to provide the desired CST response characteristic, including the rate of change of the particular property (e.g., weight loss, loss of strength) both prior to the CST and after the CST.

Figure 17:
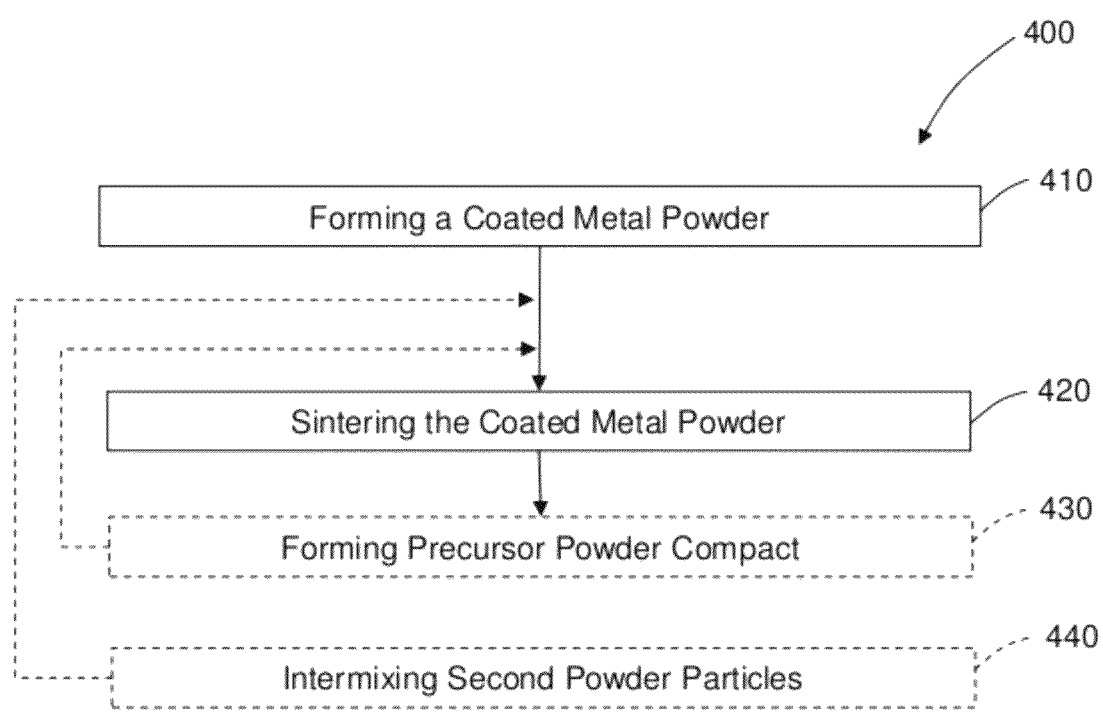
FIG. 17 is a flow chart of an exemplary embodiment of a method of making a powder compact as disclosed herein.

Referring to FIG. 17, a method 400 of making a powder compact 200. Method 400 includes forming 410 a coated metallic powder 10 comprising powder particles 12 having particle cores 14 with nanoscale metallic coating layers 16 disposed thereon, wherein the metallic coating layers 16 have a chemical composition and the particle cores 14 have a chemical composition that is different than the chemical composition of the metallic coating material 16. Method 400 also includes forming 420 a powder compact by applying a predetermined temperature and a predetermined pressure to the coated powder particles sufficient to sinter them by solid-phase sintering of the coated layers of the plurality of the coated particle powders 12 to form a substantially-continuous, cellular nanomatrix 216 of a nanomatrix material 220 and a plurality of dispersed particles 214 dispersed within nanomatrix 216 as described herein.

Forming 410 of coated metallic powder 10 comprising powder particles 12 having particle cores 14 with nanoscale metallic coating layers 16 disposed thereon may be performed by any suitable method. In an exemplary embodiment, forming 410 includes applying the metallic coating layers 16, as described herein, to the particle cores 14, as described herein, using fluidized bed chemical vapor deposition (FBCVD) as described herein. Applying the metallic coating layers 16 may include applying single-layer metallic coating layers 16 or multilayer metallic coating layers 16 as described herein. Applying the metallic coating layers 16 may also include controlling the thickness of the individual layers as they are being applied, as well as controlling the overall thickness of metallic coating layers 16. Particle cores 14 may be formed as described herein.

Forming 420 of the powder compact 200 may include any suitable method of forming a fully-dense compact of powder 10. In an exemplary embodiment, forming 420 includes dynamic forging of a green-density precursor powder compact 100 to apply a predetermined temperature and a predetermined pressure sufficient to sinter and deform the powder particles and form a fully-dense nanomatrix 216 and dispersed particles 214 as described herein. Dynamic forging as used herein means dynamic application of a load at temperature and for a time sufficient to promote sintering of the metallic coating layers 16 of adjacent powder particles 12, and may preferably include application of a dynamic forging load at a predetermined loading rate for a time and at a temperature sufficient to form a sintered and fully-dense powder compact 200. In an exemplary embodiment, dynamic forging included: 1) heating a precursor or green-state powder compact 100 to a predetermined solid phase sintering temperature, such as, for example, a temperature sufficient to promote interdiffusion between metallic coating layers 16 of adjacent powder particles 12; 2) holding the precursor powder compact 100 at the sintering temperature for a predetermined hold time, such as, for example, a time sufficient to ensure substantial uniformity of the sintering temperature throughout the precursor compact 100; 3) forging the precursor powder compact 100 to full density, such as, for example, by applying a predetermined forging pressure according to a predetermined pressure schedule or ramp rate sufficient to rapidly achieve full density while holding the compact at the predetermined sintering temperature; and 4) cooling the compact to room temperature. The predetermined pressure and predetermined temperature applied during forming 420 will include a sintering temperature, $T_S$, and forging pressure, $P_F$, as described herein that will ensure sintering, such as solid-state sintering, and deformation of the powder particles 12 to form fully-dense powder compact 200, including bond 217, such as a solid-state bond, and bond layer 219. The steps of heating to and holding the precursor powder compact 100 at the predetermined sintering temperature for the predetermined time may include any suitable combination of temperature and time, and will depend, for example, on the powder 10 selected, including the materials used for particle core 14 and metallic coating layer 16, the size of the precursor powder compact 100, the heating method used and other factors that influence the time needed to achieve the desired temperature and temperature uniformity within precursor powder compact 100. In the step of forging, the predetermined pressure may include any suitable pressure and pressure application schedule or pressure ramp rate sufficient to achieve a fully-dense powder compact 200, and will depend, for example, on the material properties of the powder particles 12 selected, including temperature dependent stress/strain characteristics (e.g., stress/strain rate characteristics), interdiffusion and metallurgical thermodynamic and phase equilibria characteristics, dislocation dynamics and other material properties. For example, the maximum forging pressure of dynamic forging and the forging schedule (i.e., the pressure ramp rates that correspond to strain rates employed) may be used to tailor the mechanical strength and toughness of the powder compact. The maximum forging pressure and forging ramp rate (i.e., strain rate) is the pressure just below the compact cracking pressure, i.e., where dynamic recovery processes are unable to relieve strain energy in the compact microstructure without the formation of a crack in the compact. For example, for applications that require a powder compact that has relatively higher strength and lower toughness, relatively higher forging pressures and ramp rates may be used. If relatively higher toughness of the powder compact is needed, relatively lower forging pressures and ramp rates may be used.

For certain exemplary embodiments of powders 10 described herein and precursor compacts 100 of a size sufficient to form many wellbore tools and components, predetermined hold times of about 1 to about 5 hours may be used. The predetermined sintering temperature, $T_S$, will preferably be selected as described herein to avoid melting of either particle cores 14, including distributed carbon nanoparticles 90, or metallic coating layers 16 as they are transformed during method 400 to provide dispersed particles 214 and nanomatrix 216. For these embodiments, dynamic forging may include application of a forging pressure, such as by dynamic pressing to a maximum of about 80 ksi at pressure ramp rate of about 0.5 to about 2 ksi/second.

In an exemplary embodiment where particle cores 14 included Mg and metallic coating layer 16 included various single and multilayer coating layers as described herein, such as various single and multilayer coatings comprising Al, the dynamic forging was performed by sintering at a temperature, $T_S$, of about 450° C. to about 470° C. for up to about 1 hour without the application of a forging pressure, followed by dynamic forging by application of isostatic pressures at ramp rates between about 0.5 to about 2 ksi/second to a maximum pressure, $P_S$, of about 30 ksi to about 60 ksi, which resulted in forging cycles of 15 seconds to about 120 seconds. The forging cycle may be affected depending on the amount of distributed carbon nanoparticles 90 included in particle cores 14, since the incorporation of the nanoparticles may change the dynamic response of the powder particles 12 during forging, such as by limiting (e.g., reducing) associated dislocation movement and slip mechanisms. The short duration of the forging cycle is a significant advantage as it limits interdiffusion, including interdiffusion within a given metallic coating layer 16, interdiffusion between adjacent metallic coating layers 16 and interdiffusion between metallic coating layers 16 and particle cores 14, to that needed to form metallurgical bond 217 and bond layer 219, while also maintaining the desirable equiaxed dispersed particle 214 shape with the integrity of cellular nanomatrix 216 strengthening phase. The duration of the dynamic forging cycle is much shorter than the forming cycles and sintering times required for conventional powder compact forming processes, such as hot isostatic pressing (HIP), pressure assisted sintering or diffusion sintering.

Method 400 may also optionally include forming 430 a precursor powder compact by compacting the plurality of coated powder particles 12 sufficiently to deform the particles and form interparticle bonds to one another and form the precursor powder compact 100 prior to forming 420 the powder compact. Compacting may include pressing, such as isostatic pressing, of the plurality of powder particles 12 at room temperature to form precursor powder compact 100. Compacting 430 may be performed at room temperature. In an exemplary embodiment, powder 10 may include particle cores 14 comprising Mg and forming 430 the precursor powder compact may be performed at room temperature at an isostatic pressure of about 10 ksi to about 60 ksi.

Method 400 may optionally also include intermixing 440 a second powder 30 into powder 10 as described herein prior to the forming 420 the powder compact, or forming 430 the precursor powder compact.

Without being limited by theory, powder compacts 200 are formed from coated powder particles 12 that include a particle core 14 and associated core material 18 as well as a metallic coating layer 16 and an associated metallic coating material 20 to form a substantially-continuous, three-dimensional, cellular nanomatrix 216 that includes a nanomatrix material 220 formed by sintering and the associated diffusion bonding of the respective coating layers 16 that includes a plurality of dispersed particles 214 of the particle core materials 218. This unique structure may include metastable combinations of materials that would be very difficult or impossible to form by solidification from a melt having the same relative amounts of the constituent materials. The coating layers and associated coating materials may be selected to provide selectable and controllable dissolution in a predetermined fluid environment, such as a wellbore environment, where the predetermined fluid may be a commonly used wellbore fluid that is either injected into the wellbore or extracted from the wellbore. As will be further understood from the description herein, controlled dissolution of the nanomatrix exposes the dispersed particles of the core materials. The particle core materials may also be selected to provide selectable and controllable dissolution in the wellbore fluid. Alternately, they may also be selected to provide a particular mechanical property, such as compressive strength or sheer strength, to the powder compact 200, without necessarily providing selectable and controlled dissolution of the core materials themselves, since selectable and controlled dissolution of the nanomatrix material surrounding these particles will necessarily release them so that they are carried away by the wellbore fluid. The microstructural morphology of the substantially-continuous, cellular nanomatrix 216, which may be selected to provide a strengthening phase material, with dispersed particles 214, which may be selected to provide equiaxed dispersed particles 214, provides these powder compacts with enhanced mechanical properties, including compressive strength and sheer strength, since the resulting morphology of the nanomatrix/dispersed particles can be manipulated to provide strengthening through the processes that are akin to traditional strengthening mechanisms, such as grain size reduction, solution hardening through the use of impurity atoms, precipitation or age hardening and strength/work hardening mechanisms. The nanomatrix/dispersed particle structure tends to limit dislocation movement by virtue of the numerous particle nanomatrix interfaces, the interfaces between discrete layers within the nanomatrix material and the incorporation of distributed carbon nanoparticles 90 or second distributed carbon nanoparticles 92, as described herein. The fracture behavior of powder compacts of these materials may demonstrate intergranular fracture in response to shear stresses sufficient to induce failure. In contrast, powder compacts 200 made using powder particles 12 having pure Mg powder particle cores 14 to form dispersed particles 214 and metallic coating layers 16 that includes Al to form nanomatrix 216 and subjected to a shear stress sufficient to induce failure demonstrated transgranular fracture and a substantially higher fracture stress as described herein. Because these materials have high-strength characteristics, the core material and coating material may be selected to utilize low density materials or other low density materials, such as low-density metals, ceramics or glasses, that otherwise would not provide the necessary strength characteristics for use in the desired applications, including wellbore tools and components.

While one or more embodiments have been shown and described, modifications and substitutions may be made thereto without departing from the spirit and scope of the invention. Accordingly, it is to be understood that the present invention has been described by way of illustrations and not limitation.

The invention claimed is:

1. A powder metal composite, comprising:
a substantially-continuous, cellular nanomatrix comprising a nanomatrix material;
a plurality of dispersed particles comprising a particle core material that comprises Mg, Al, Zn or Mn, or a combination thereof, dispersed in the cellular nanomatrix, the core material of the dispersed particles comprising a plurality of distributed carbon nanoparticles; and
a solid state bond layer extending throughout the cellular nanomatrix between the dispersed particles, the powder metal composite comprising deformed powder particles formed by compacting powder particles comprising a particle core and at least one coating layer, the coating layers joined by solid-state bonding to form the substantially-continuous, cellular nanomatrix and leave the particle cores as the dispersed particles.

2. The powder metal composite of claim 1, wherein the nanomatrix material has a melting temperature (TM), the particle core material has a melting temperature (TDP); wherein the compact is sinterable in a solid-state at a sintering temperature (TS), and TS is less than TM and TDP.

3. The powder metal composite of claim 1, wherein the particle core material comprises Mg—Zn, Mg—Zn, Mg—Al, Mg—Mn, or Mg—Zn—Y.

4. The powder metal composite of claim 1, wherein the core material comprises an Mg—Al—X alloy, wherein X comprises Zn, Mn, Si, Ca or Y, or a combination thereof.

5. The powder metal composite of claim 4, wherein the Mg—Al—X alloy comprises, by weight, up to about 85% Mg, up to about 15% Al and up to about 5% X.

6. The powder metal composite of claim 1, wherein the dispersed particles further comprise a rare earth element.

7. The powder metal composite of claim 1, wherein the dispersed particles have an average particle size of about 5 µm to about 300 µm.

8. The powder metal composite of claim 1, wherein the dispersion of dispersed particles comprises a substantially homogeneous dispersion within the cellular nanomatrix.

9. The powder metal composite of claim 1, wherein the dispersion of dispersed particles comprises a multi-modal distribution of particle sizes within the cellular nanomatrix.

10. The powder metal composite of claim 1, wherein the dispersed particles have an equiaxed particle shape.

11. The powder metal composite of claim 1, further comprising a plurality of dispersed second particles, wherein the dispersed second particles are also dispersed within the cellular nanomatrix and with respect to the dispersed particles.

12. The powder metal composite of claim 11, wherein the dispersed second particles comprise Fe, Ni, Co or Cu, or oxides, nitrides or carbides thereof, or a combination of any of the aforementioned materials.

13. The powder metal composite of claim 1, wherein the nanomatrix material comprises Al, Zn, Mn, Mg, Mo, W, Cu, Fe, Si, Ca, Co, Ta, or Re or Ni, or an oxide, carbide or nitride thereof, or a combination of any of the aforementioned materials, and wherein the nanomatrix material has a chemical composition and the particle core material has a chemical composition that is different than the chemical composition of the nanomatrix material.

14. The powder metal composite of claim 13, wherein the nanomatrix material comprises Al, Mn, Mo, W, Fe, Ca, Co, Ta, or Re, or an oxide, carbide or nitride thereof, or a combination of any of the aforementioned materials, and wherein the nanomatrix material has a chemical composition and the particle core material has a chemical composition that is different than the chemical composition of the nanomatrix material.

15. The powder metal composite of claim 1, wherein the cellular nanomatrix has an average thickness of about 50 nm to about 5000 nm.

16. The powder metal composite of claim 1, wherein the compact is formed from a sintered powder comprising a plurality of powder particles, each powder particle having a particle core that upon sintering comprises a dispersed particle and a single metallic coating layer disposed thereon, and wherein the cellular nanomatrix between adjacent ones of the plurality of dispersed particles comprises the single metallic coating layer of one powder particle, the bond layer and the single metallic coating layer of another of the powder particles.

17. The powder metal composite of claim 16, wherein the dispersed particles comprise Mg and the cellular nanomatrix comprises Al or Ni, or a combination thereof.

18. The powder metal composite of claim 1, wherein the compact is formed from a sintered powder comprising a plurality of powder particles, each powder particle having a particle core that upon sintering comprises a dispersed particle and a plurality of metallic coating layers disposed thereon, and wherein the cellular nanomatrix between adjacent ones of the plurality of dispersed particles comprises the plurality of metallic coating layers of one powder particle, the bond layer and plurality of metallic coating layers of another of the powder particles, and wherein adjacent ones of the plurality of metallic coating layers have different chemical compositions.

19. The powder metal composite of claim 18, wherein the plurality of layers comprises a first layer that is disposed on the particle core and a second layer that is disposed on the first layer.

20. The powder metal composite of claim 19, wherein the dispersed particles comprise Mg and the first layer comprises Al or Ni, or a combination thereof, and the second layer comprises Al, Zn, Mn, Mg, Mo, W, Cu, Fe, Si, Ca, Co, Ta, Re or Ni, or a combination thereof, wherein the first layer has a chemical composition that is different than a chemical composition of the second layer.

21. The powder metal composite of claim 20, metal powder of claim 18, further comprising a third layer that is disposed on the second layer.

22. The powder metal composite of claim 21, wherein the first layer comprises Al or Ni, or a combination thereof, the second layer comprises Al, Zn, Mn, Mg, Mo, W, Cu, Fe, Si, Ca, Co, Ta, Re or Ni, or an oxide, nitride or carbide thereof, or a combination of any of the aforementioned second layer materials, and the third layer comprises Al, Zn, Mn, Mg, Mo, W, Cu, Fe, Si, Ca, Co, Ta, Re or Ni, or a combination thereof, wherein the second layer has a chemical composition that is different than a chemical composition of the third layer.

23. The powder metal composite of claim 22, further comprising a fourth layer that is disposed on the third layer.

24. The powder metal composite of claim 23, wherein the first layer comprises Al or Ni, or a combination thereof, the second layer comprises Al, Zn, Mn, Mg, Mo, W, Cu, Fe, Si, Ca, Co, Ta, Re or Ni, or an oxide, nitride or carbide thereof, or a combination of any of the aforementioned second layer materials, the third layer comprises Al, Zn, Mn, Mg, Mo, W, Cu, Fe, Si, Ca, Co, Ta, Re or Ni, or an oxide, nitride or carbide thereof, or a combination of any of the aforementioned third layer materials, and the fourth layer comprises Al, Mn, Fe, Co or Ni, or a combination thereof, wherein the second layer has a chemical composition that is different than a chemical composition of the third layer and the third layer has a chemical composition that is different than a chemical composition of the third layer.

25. The powder metal composite of claim 1, wherein the carbon nanoparticles comprise graphene, fullerene or nanodiamond nanoparticles, or a combination thereof.

26. The powder metal composite of claim 25, wherein the core material comprises a fullerene, and the fullerene comprises a single-wall nanotube, multi-wall nanotube, buckyball or buckyball cluster, or a combination thereof.

27. The powder metal composite of claim 25, wherein the distributed carbon nanoparticles have at least one dimension of about 0.1 nm to about 100 nm.

28. The powder metal composite of claim 25, wherein the carbon nanoparticles are dispersed substantially homogeneously within the dispersed particles.

29. The powder metal composite of claim 25, wherein the carbon nanoparticles are dispersed substantially heterogeneously within the dispersed particles.

30. The powder metal composite of claim 29, wherein the carbon nanoparticles are dispersed proximate a periphery of the dispersed particles.

31. A powder metal composite, comprising:
a substantially-continuous, cellular nanomatrix comprising a nanomatrix material;
a plurality of dispersed particles comprising a particle core material that comprises a metal having a standard oxidation potential less than Zn, ceramic, glass, or carbon, or a combination thereof, dispersed in the cellular nanomatrix, the core material of the dispersed particles comprising a plurality of distributed carbon nanoparticles; and
a solid state bond layer extending throughout the cellular nanomatrix between the dispersed particles, the powder metal composite comprising deformed powder particles formed by compacting powder particles comprising a particle core and at least one coating layer, the coating layers joined by solid-state bonding to form the substantially-continuous, cellular nanomatrix and leave the particle cores as the dispersed particles.

32. The powder metal composite of claim 31, wherein the nanomatrix material comprises Al, Zn, Mn, Mg, Mo, W, Cu, Fe, Si, Ca, Co, Ta, or Re or Ni, or an oxide, carbide or nitride thereof, or a combination of any of the aforementioned materials, and wherein the nanomatrix material has a chemical composition and the core material has a chemical composition that is different than the chemical composition of the nanomatrix material.

33. The powder metal composite of claim 31, wherein the carbon nanoparticles comprise graphene, fullerene or nanodiamond nanoparticles, or a combination thereof.

34. The powder metal composite of claim 33, wherein the core material comprises a fullerene, and the fullerene comprises a single-wall nanotube, multi-wall nanotube, buckyball or buckyball cluster, or a combination thereof.

35. The powder metal composite of claim 31, wherein the bond layer comprises a solid-state bond layer.

36. The powder metal composite of claim 35, wherein the nanomatrix material has a melting temperature (TM), the particle core material has a melting temperature (TDP); wherein the compact is sinterable in a solid-state at a sintering temperature (TS), and TS is less than TM and TDP.

37. A powder metal composite, comprising:
a substantially-continuous, cellular nanomatrix comprising a nanomatrix material;
a plurality of dispersed particles comprising a particle core material that comprises Mg, Al, Zn or Mn, or a combination thereof, dispersed in the cellular nanomatrix, the core material of the dispersed particles comprising a plurality of distributed carbon nanoparticles comprising a graphene, fullerene or nanodiamond nanoparticles, or a combination thereof, the fullerenes comprising buckyballs or buckyball clusters, or a combination thereof; and
a solid state bond layer extending throughout the cellular nanomatrix between the dispersed particles, the powder metal composite comprising deformed powder particles formed by compacting powder particles comprising a particle core and at least one coating layer, the coating layers joined by solid-state bonding to form the substantially-continuous, cellular nanomatrix and leave the particle cores as the dispersed particles.

* * * * *